United States Patent [19]

Grannis et al.

[11] 3,772,536

[45] Nov. 13, 1973

[54] DIGITAL CELL FOR LARGE SCALE INTEGRATION

[75] Inventors: Norman J. Grannis, Palos Verdes; Ted Winkler, Inglewood, both of Calif.

[73] Assignee: TRW Inc., Redondo Beach, Calif.

[22] Filed: July 19, 1971

[21] Appl. No.: 164,080

Related U.S. Application Data

[63] Continuation of Ser. No. 669,091, Sept. 20, 1967, abandoned.

[52] U.S. Cl. ............. 307/304, 307/205, 317/235 R, 317/235 G

[51] Int. Cl. ............ H01l 11/00

[58] Field of Search ................. 317/235 G; 307/205, 307/213, 215

[56] References Cited

UNITED STATES PATENTS

| | | | |
|---|---|---|---|
| 3,365,707 | 1/1968 | Mayhew | 317/235 |
| 3,406,298 | 10/1968 | Axelrod | 317/235 |
| 3,479,523 | 11/1969 | Pleshko | 317/235 |
| 3,643,232 | 2/1972 | Kilby | 317/235 |

FOREIGN PATENTS OR APPLICATIONS

| | | | |
|---|---|---|---|
| 1,045,769 | 10/1966 | Great Britain | 317/235 |

*Primary Examiner*—Jerry D. Craig
*Attorney*—Daniel T. Anderson, Donald C. Keaveney and Gerald Singer

[57] ABSTRACT

There is disclosed an article and method of fabrication thereof comprising an integrated semiconductor circuit in the form of a digital cell of standard configuration suitable for universal use in large scale integrated circuit arrays which may be mass produced up to the final interconnecting metallization step and thereafter stored for use in filling custom orders in accordance with a large variety of interconnection patterns to convert the array of standard digital cells to one of many possible functional systems. Each cell comprises a logic stage or gate circuit of universal applicability which may be interconnected with other similar cells in a large number of different ways to form completed circuits. The multiplicity of possible circuits are in general built by repetitive utilization of "nor" gates, "nand" gates, "transfer" gates and load devices.

5 Claims, 40 Drawing Figures

INVENTORS
NORMAN J. GRANNIS
TED WINKLER
BY
Donald C Kearney
ATTORNEY

NORMAN J. GRANNIS
TED WINKLER
INVENTORS

BY
Donald C. Kearney
ATTORNEY

SOURCE & DRAIN MASK

NORMAN J. GRANNIS
TED WINKLER
INVENTORS

BY
Donald C Kearney
ATTORNEY

NORMAN J. GRANNIS
TED WINKLER
INVENTORS

BY
Donald C Kearney
ATTORNEY

PATENTED NOV 13 1973

3,772,536

SHEET 05 OF 15

CONTACT MASK

NORMAN J. GRANNIS
TED WINKLER
INVENTORS

BY

Donald C Kearney
ATTORNEY

INTERCONNECTION MASK

NORMAN J. GRANNIS
TED WINKLER
INVENTORS

BY Donald C Kearney
ATTORNEY

PATENTED NOV 13 1973 3,772,536

SHEET 07 OF 15

NORMAN J. GRANNIS
TED WINKLER
INVENTORS

BY Donald C Kearney
ATTORNEY

INVENTORS
NORMAN J. GRANNIS
TED WINKLER
BY
Donald C Keaveney
ATTORNEY

INVENTORS
NORMAN J. GRANNIS
TED WINKLER
BY
Donald C Kearney
ATTORNEY

INVENTORS
NORMAN J. GRANNIS
TED WINKLER
BY
Donald C Keavney
ATTORNEY

INVENTORS
NORMAN J. GRANNIS
TED WINKLER
BY
Donald C Keaveney
ATTORNEY

INVENTORS
NORMAN J. GRANNIS
TED WINKLER
BY
Donald C Keaveney
ATTORNEY

NORMAN J. GRANNIS
TED WINKLER
INVENTORS

BY
Donald C Kearney
ATTORNEY

INVENTORS
NORMAN J. GRANNIS
TED WINKLER
BY
Donald C Kearney
ATTORNEY

INVENTORS
NORMAN J. GRANNIS
TED WINKLER
BY
Donald C Kearney
ATTORNEY

DIGITAL CELL FOR LARGE SCALE INTEGRATION

This application is a continuation of copending application Ser. No. 669,091, filed Sept. 20, 1967, now abandoned.

BACKGROUND OF THE INVENTION

The techniques used in what is commonly referred to as microelectronics have achieved not merely a large reduction in weight and size of electronic components and circuits, but have also achieved and are continuing to increasingly achieve reductions in cost and improvements in reliability which make practical an entirely new order of allowable system complexity. One important approach to microelectronics is provided by semiconductor integrated circuitry, the technology of which sprang naturally from transistor and diode technology.

The term "semiconductor integrated circuitry" has been applied to a wide variety of levels of sophistication. Two extremes, for example, are the chip approach wherein individual components such as transistors, resistors, and diodes are produced on separate pieces of material. These separate components are then mounted and interconnected in a single package to produce a circuit function by what is really a microassembly technique. The other extreme produces the entire electronic function in and upon a single piece of semiconductor material having many components or regions in the monolithic wafer that are isolated or interconnected electrically as the circuit requires. Normally, in this monolithic approach all the intraconnections within the functional block will be made by batch processing on large numbers of circuits. The only individual assembly operations are associated with mounting the final circuit function wafer in a package so that it can be connected conveniently to the outside world.

The chip or microcomponent approach, of course, has the advantage of affording high volume mass production of the individual components which can later be connected in a large number of different circuits to meet a plurality of market needs or applications. On the other hand, the monolithic functional wafer approach has distinct advantages of reliability, size, weight, and cost per total circuit function assuming a sufficient level of demand for the particular circuit of greater complexity and hence more specific and limited applicability.

Examples of producing semiconductor devices in a monolithic wafer are shown by the U. S. Pat. to Axelrod, No. 3,406,298 and Mayhew, No. 3,365,707. Axelrod notes that a large number of active devices may be placed onto a single wafer along with functional interconnections to form operative circuit arrangements, including a NOR function circuit having a resistive load created by interconnecting field effect transistors. Mayhew disclosed that two unconnected sets of paired transistors having an unconditional connection point associated with each pair may be repeatedly formed into an array upon a single wafer. External metalization interconnections between the sets and other like sets may then be made to form logical operations.

It is an object of this invention to provide an article and method of fabrication thereof which retains the above-noted advantages of the monolithic wafer approach to semiconductor integrated circuits while yet achieving most of the flexibility and high volume economy inherent in the microcomponent or chip technique.

It is a further object of this invention to provide a digital cell comprising a universal logic circuit having a plurality of terminals available from a gate circuit arrangement formed in a monolithic semiconductor wafter.

It is a still further object of this invention to provide a digital cell comprising a logic stage of universal applicability from which many more complex circuits may be fabricated by simple interconnection of appropriate pre-existing available terminals in order to facilitate large scale integration at reasonable cost of circuits of greater complexity than has heretofore been feasible.

SUMMARY OF THE INVENTION

These and other objects and advantages are achieved, as will be more apparent from the detailed discussion below, by providing an integrated circuit semiconductor wafer comprising a plurality of Metal Oxide Silicon Field Effect Transistors formed in a digital cell circuit which itself is repeated as many times on a single substrate as is practical; and then, in a later separate process, interconnecting the available terminals from each cell in such a manner as to form the parts of a digital machine such as an electronic computer, data processor, telemetry equipment or the like. The digital cell is designed to serve as a building block of universal applicability in a very large number of circuits. In complexity it is midway between the traditional concept of a component and the concept of a full integrated circuit. It thus shares many of the advantages of both and makes large scale integration economically practical.

Each digital cell, in a preferred embodiment comprises five P-channel enhancement mode Metal-Oxide-Silicon Field Effect Transistors connected to form a logic circuit. Provision for interconnection to other identical cells is provided by eight bonding pads. The cell may be used alone or in combination with other identical cells to form NOR gates, OR gates, R-S flip-flops, J-K flip-flops, binary flip-flops, exclusive OR gates, shift registers, active memories and other digital logic elements. A four cell chip measures approximately 62 × 65 mils. More than 500 cells can easily be formed in a single wafer. In a preferred embodiment the average power dissipation per cell was typically 3 milliwatts and the average propagation delay was less than 200 nanoseconds.

BRIEF DESCRIPTION OF THE DRAWINGS

FIG. 10(*a*) shows the connection for a three-input NOR gate.

FIG. 11(*a*) shows the circuit connection using two digital cells to form a three-input OR gate.

FIG. 12(*a*) shows the circuit connections for using two digital cells to form an R-S flip-flop circuit.

FIG. 13(*a*) shows the circuit connections for using three digital cells to form an exclusive OR gate.

FIG. 14(*a*) shows the circuit connections for using two digital cells in a dynamic shift register.

FIG. 15(*a*) shows the circuit connections for using two digital cells in a dynamic shift register with a delayed latch pulse.

FIG. 16(*a*) shows the circuit connection for using four digital cells to form a two flip-flop binary.

FIGS. 10(*b*)-16(*b*) show waveforms for the cells of FIGS. 10(*a*)–16(*a*), respectively.

FIG. 17(*a*) shows the circuit configuration for using six digital cells to form a three flip-flop binary.

FIG. 17(*b*) and 17(*c*) are graphs of alternate possible input and output voltage to the circuit of FIG. 17.

FIG. 18(*a*) shows the circuit configuration for using 19 digital cells including 58 transistors to form a four bit ring counter.

FIG. 18(*b*) shows the waveforms for the cells of FIG. 18(*a*).

DESCRIPTION OF THE PREFERRED EMBODIMENTS

Figure 1A:
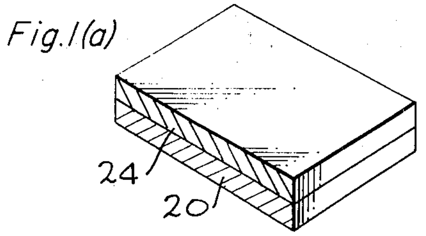
FIGS. 1(*a*) - 1(*k*), 1(*m*) and 1(*n*) a series of cut-away isometric views illustrating the process by which a typical single field effect transistor of the type used herein is manufactured. Exemplary masks used in the process are shown at views 1(*b*), 1(*e*), 1(*h*), and 1(*k*). The remaining views illustrate the effect on the initial block of material shown in view (a) of the steps performed using the masks.
Figure 1B:
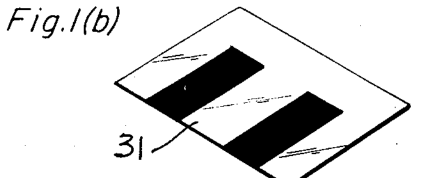
Figure 1C:
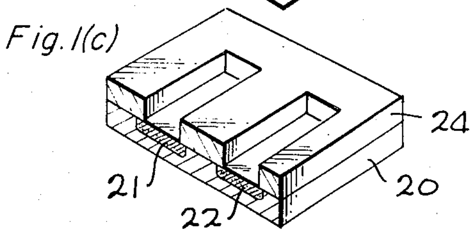
Figure 1D:
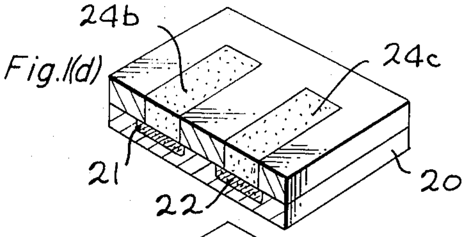
Figure 1E:
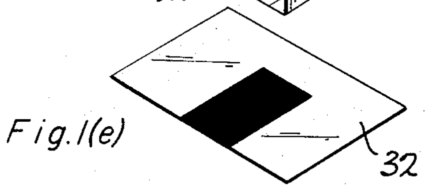
Figure 1F:
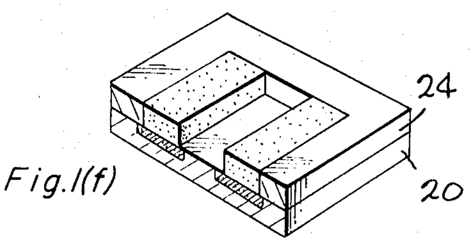
Figure 1G:
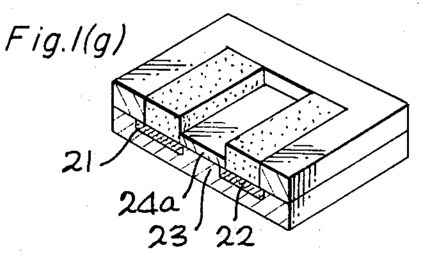
Figure 1H:
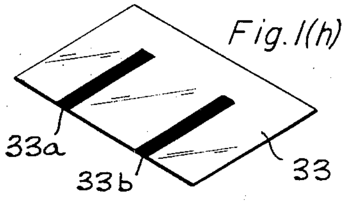
Figure 1I:
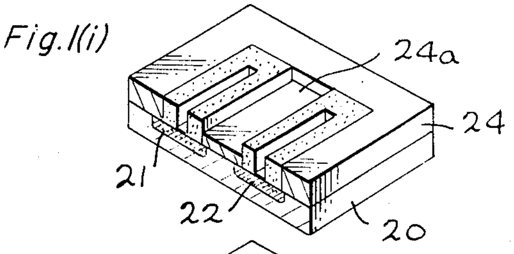
Figure 1J:
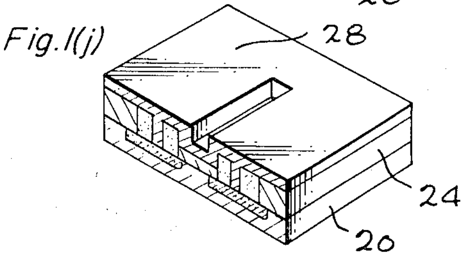
Figure 1K:
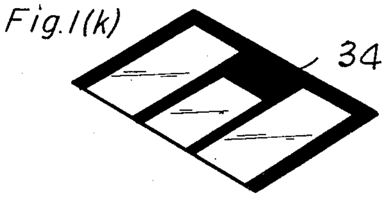
Figure 1M:
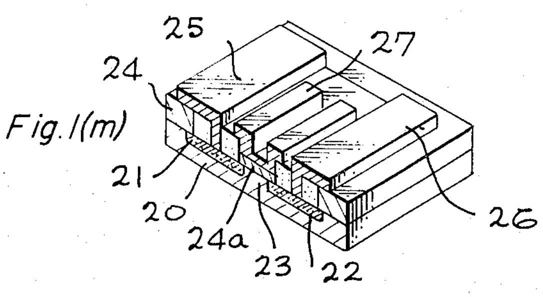
Figure 1N:
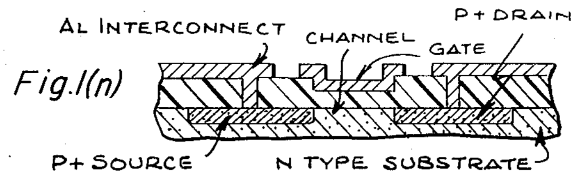

Although the digital cell circuit referred to above could be implemented with many different kinds of active elements such as bipolar junction transistors in either integrated or discrete component form, it is presently preferred to fabricate the digital cell circuit from Metal Oxide Silicon Field Effect Transistors which have been formed in a monolithic silicon wafer, since this integrated circuit version of the MOSFET affords the maximum manufacturing advantages and economies and the maximum flexiblity of application for the circuit described herein. Since this is, in fact, the preferred form, a brief description will first be given of the structure and principles of operation of a single Metal Oxide Silicon Field Effect Transistor (hereinafter referred to as a MOSFET). Thereafter, a brief description of the method of manufacturing such a single device will be given in order to simplify this aspect of the description. Subsequent to this, the actual physical layout of the complete integrated circuit digital cell which forms the subject matter of the invention will be described. Such an actual cell is, of course, manufactured by the same process as that used for a single cell, the only difference being in the complexity of the structures, which aspect will be isolated for separate discussion. Finally, there will be described and illustrated a number of exemplary applications which can be derived from the digital cell by making appropriate interconnections between various numbers of cells.

In FIG. 1(*m*) there is shown a cut away perspective view of a single MOSFET and in FIG. 1(*n*) there is shown an enlarged cross-sectional view of the device of FIG. 1(*m*). In these two views there is shown a semiconductor wafer 20 which comprises a substrate of N-type silicon. Formed in this N-type substrate is a source region 21 and a drain region 22. Both the source and drain are formed of P+ type silicon and are spearated by an area 23 of N-type silicon which functions as a conduction channel under appropriate operating conditions. The P+ regions forming the source and drain are formed in the silicon wafer by diffusion steps to be described in greater detail below. Above the surface of the wafer is a layer 24 of silicon dioxide. Layer 24 has etched through it holes through which contact is made to the source and drain regions by aluminum interconnect or contact material. Thus, contact area 25 extends through the silicon dioxide to form the source electrode whereas the contact 26 extends through the silicon dioxide to form the drain electrode. The gate electrode 27 is separated from electrodes 25 and 26 electrically and is positioned above the channel area 23. The gate electrode 27 normally has input signal voltage applied to it and forms with the area 23, the two plates of the capacitor of which the thin silicon dioxide layer between electrode 27 and channel 23 forms the dielectric.

Figure 2:
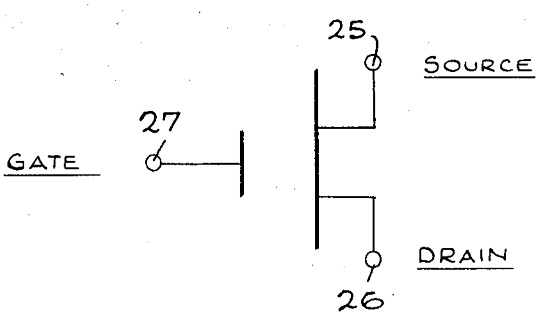
FIG. 2 is a schematic view defining a diagram used throughout the drawings to indicated an MOS field effect transistor of the type shown in FIG. 1(*n*) as manufactured by the process illustrated in FIG. 1.

The device shown in FIGS. 1(*m*) and 1(*n*) is commonly illustrated in circuit diagrams in the art in the manner shown in FIG. 2. This schematic circuit representation will be used throughout this specification. It will be noted in FIG. 2 that the gate electrode 27 and the source and drain electrodes 25 and 26 represent parts having corresponding reference characters in FIG. 1(*m*). Not only does this device afford many advantages from a manufacturing point of view but also it is a semiconductor transistor device which is capable of combining the high input impedance of a typical vacuum tube with many of the advantages offered by junction transistors, such as the ability to be DC coupled without level shifting.

The name MOS is derived from the sandwich-like structure of Metal (usually aluminum), Oxide ($SiO_2$)), and Silicon shown in FIGS. 1(*m*) and 1(*n*). The metal forms the central electrode 27 which we have called the gate and is isolated from the body of the device by a thin but very non-conductive layer of silicon oxide 24. This oxide layer accounts for the extremely high input resistance of the device which it typically as great as $10^{14}$ ohms. The metal gate electrode 27 is separated from the body of the device by a layer of silicon dioxide of about 1,000 Angstrom thickness. The gate and body thus form a parallel plate capacitor, the silicon dioxide forming a dielectric layer between the two plates. The semiconductor region 23 directly beneath the gate is called the channel.

When no charge is on the gate, the channel is N-type silicon, since it is an integral part of the N-type body or substrate. In this condition, if a potential is applied between source and drain, no current will flow, because, regardless of the polarity of the applied potential, one of the P-N junctions formed by the source, body and drain will be reverse biased.

If the gate is charged negative with respect to body and source, an equal amount of positive charge must accumulate in the channel region. This positive charge (in the form of holes) comes mainly from the source. The presence of the induced holes in the channel region begins to shift the channel from the N-type towards the P-type.

The gate voltage ($V_T$) at which just enough induced charge is present to make the channel change from N to P is called the threshold voltage. At this point, the P-N junctions between source, channel and drain disappear at the surface and ohmic conduction between source and drain can occur in either direction. The conductivity will be very slight, however, since only a very thin surface layer of the channel will be inverted. As the gate is made more and more negative, the inverted layer will go deeper and deeper, increasing conductivity from source to drain.

The simplest possible model for this behavior is derived by considering the channel to be a uniform conducting slab of length L width w and thickness h, where h depends on the gate voltage, $V_G$. The source and drain make ohmic contact to the channel. The resistance from the source to the drain is then given by:

$$R_{s-d} = \rho\ L/w\ h \qquad (1)$$

where $\rho$ is the resistivity of the slab and is assumed constant. If one further assumes that the thickness of the slab is simply proportional to the charge induced in the channel, minus the charge necessary to make the channel change from N to P (i.e., the charge induced by the threshold voltage), EQuation 1 becomes:

$$R_{s-d} = \rho\ L/w\ K'\ (V_G - V_T) \qquad (2)$$

where K' is a proportionality constant. For a given geometry, $\rho$, L, $w$, and K' are all constants so that equation 2 can be written:

$$R_{s-d} = 1/K(V_G - V_T); \qquad (3)$$

where K is a constant.

Thus, a graphic plot of R versus $V_G$ at a constant drain voltage shows a 1/X characteristic since R varies inversely as $V_G$). In this sense, then, the device can be thought of as a voltage controlled variable resistor, the value of which is controlled by the gate voltage. The resistance between the source and the drain remains very high (often $10^{10}$ ohms) as the gate is made more and more negative until the threshold voltage of the device is reached. At this point, the resistance decreases rapidly. The resistance continues to decrease with more negative gate voltage but the rate of change diminishes and the resistance approaches a limiting value which is determined by the geometry of the device. The threshold voltage is an important characteristic. It is this property which gives digital circuits employing MOS transistors their extremely high noise immunity. Noise signals which would saturate regular bipolar transistors are completely rejected by the MOST if they are below the threshold which is approximately −4 volts.

In summary then, the MOST has higher input resistance than the best vacuum tubes but can be DC coupled without the need of level shifting. It has much higher noise immunity than bipolar transistors, but still maintains the advantages of low power, small physical size, rugged construction, and ability to operate without filaments. These characteristics render the device ideally suited for the fabrication of large scale integrated digital circuitry. As has been noted originally above, such large scale integration is best achieved by fabrication of the digital cell of the present invention comprising an interconnected group of MOS transistors.

For a more complete discussion of the characteristics and a more rigorous theoretical analysis of the performance of Metal Oxide Silicon Field Effect Transistors, reference is made to an article by C. T. Sah which was published in the "Transactions of Electron Devices" by the Institute of Electrical and Electronics Engineer, under the title, "Characteristics of the Metal-Oxide-Semiconductor Transistor," in July 1964 and which appeared on pages 324 through 345 of the "Transactions on Electron Devices."

For purposes of illustration of a suitable manufacturing process, there will first be described the series of manufacturing steps by which a device of the type described above and shown in FIGS. 1(*m*) and (*n*) and indicated by the schematics of FIG. 2 can be manufactured. For a more complete discussion of general conventional manufacturing techniques which will be assumed herein, reference is made to a book entitled, *Microelectronics*, edited by Edward Keonjian and published by the McGraw Hill Book Company of New York in 1963. Reference is particularly made to pages 289 through 301 for a discussion of known photolithographic techniques of surface geometry control, techniques of metallization for interconnection and packaging techniques.

Turning now to FIG. 1(*a*) through 1(*n*), it will be seen from FIG. 1(*a*) that a layer 24 of silicon oxide ($SiO_2$) is first thermally grown on an N-type silicon wafer 20. Next, there is applied to the upper surface of layer 24 a photoresist solution which is not illustrated as such in the drawing. Suitable solutions and techniques for this step are described, for example, on pages 289 and 290 of the Keonjian book. As pointed out therein, these resists are photosensitive materials which act as a mask against chemical etchants. The resists are usually low molecular weight organic compounds which polymerize when subjected to ultraviolet radiation. This radiation is applied through a mask which may, for example, be of the type shown in FIG. 1(*b*) as the mask 31 defining the source and drain areas for the exemplary device. The mask is, of course, registered with the entire surface to be exposed and has opaque portions in the areas where it is later desired to etch through the silicon oxide layer 24. Since the ultraviolet light does not penetrate these opaque areas, the resist material under them is not polymerized and is therefore readily removed from the surface after the exposure to ultraviolet. The portions of the surface which lie under the transparent areas of the mask 31 receive the ultraviolet light which polymerizes the resist material and causes it to adhere to the surface strongly enough to resist ordinary washing techniques. This resist material forms a mask over the silicon oxide layer which mask is not penetrated by etchant material later used to etch away the exposed portions of the silicon oxide.

After the unwanted photoresist lying under the opaque portions of the mask have been removed, an etching solution is applied to etch the silicon oxide layer 24 down to the silicon over the areas in which it is desired to form the source and drain of the MOST. The usual etchant is buffered hydroflueric acid.

The source and drain areas 21 and 22 are then formed in the wafer 20 by thermal diffusion of a suitable impurity element in the areas etched away after exposure through the mask 31. The result of the above series of steps is shown in FIG. 1(*c*). The polymerized resist is next stripped off by any suitable stripping solution. The etching, silicon oxide masking, and thermal diffusion and stripping steps are all conventional and well known in the art. After the source and drain areas 21 and 22 are formed, the etched away areas of the silicon oxide layer are re-oxidized to produce the structure shown in FIG. 1(*d*) wherein the etched away areas of layer 24 have been regrown as at 24(*b*) and 24(*c*) to again afford a continuous silicon oxide mask over which photoresist solution is again applied.

The regrown solid surface which has again been coated with photoresist is then exposed to ultraviolet light through the gate mask 32 shown in FIG. 1(*e*). Again, the unwanted photoresist is washed away and the silicon under the gate area is etched down to the silicon layer 20. The device at this stage of processing is shown in FIG. 1(*f*). The thin silicon oxide layer 24(*a*) is then regrown over the gate area and above the channel area 23 thereby producing a structure as shown in FIG. 1(*g*).

Again, the entire stop surface which is coated with silicon oxide is stripped and has a new photoresist layer applied thereto. This photoresist is next exposed through the contact mask shown at 33 in FIG. 1(*h*). As in earlier steps the unwanted photoresist is removed by washing and the exposed silicon oxide is etched down to the silicon layer at the contact areas defined by the opaque portions 33(*a*) and 33(*b*) of mask 33. It will, of course, be understood that conventional means not shown herein are used to properly index or register the positions of masks 31, 32, and 33 so that the multiple exposures have the effect of forming a single related pattern as is common in photolithographic techniques. After the contact areas have been etched away, the device will appear as shown in FIG. 1(*i*). A layer of aluminum is next deposited over the entire wafer. This aluminum layer is shown in FIG. 1(*j*) as the layer 28.

Next, there is applied to the aluminum surface 28 a suitable photoresist layer to prepare for the final photoetching step. This layer is then exposed through the interconnection mask 34 shown in FIG. 1(*k*). Again, the unwanted photoresist is removed by washing and the metal is etched down to the silicon oxide layer 24 in order to form the interconnect pattern and thereby produce the device as shown in FIG. 1(*m*). It will be noted that the result of etching away the excess aluminum results in forming from the aluminum sheet 28 three separate electrode contacts, namely, the source contact 25 which extends down through the silicon oxide layer to make contact with the P+ source area 21, the gate electrode 27 which forms with the channel area 23 the two plates of a parallel plate capacitor for which the silicon oxide layer 24(*a*) forms the dielectric, and the drain electrode 26 which extends down through the silicon oxide layer 24 to make contact with the P+ drain area 22.

After producing the device of FIG. 1(*m*) by etching, the unwanted photoresist is, as usual, removed by a suitable stripping solvent. After removal of the excess photoresist, the wafer is sintered to provide a low silicon to metal contact resistance. The device is then probe tested to assure operative electrical characteristics as desired. Of course, where in production of the device to be described below a large number of such MOSFET's are produced on a single wafer each of them will be probe tested. The wafer is then diced into chips of a suitable size as desired in accordance with the characteristics below.

As noted above, a device of the type shown in FIGS. 1(*m*) and 1(*n*) will be schematically represented hereinafter as shown in FIG. 2. It will, of course, be understood that by wire bonding between terminal pads or by applying over devices of the type shown in FIG. 1(*m*), a suitable additional insulating layer above which further metalization and interconnect layers may be applied, a number of the individual devices may be interconnected in various desired circuit configurations. Such configurations can also and preferably be formed when a large number of MOSFET's are produced in a single wafer, by using a more elaborate mask in the initial interconnection step illustrated by way of example, by the use of mask 34 and FIG. 1(*k*). The more nearly completely the finally desired interconnection pattern can be formed in the first contact and interconnection forming step, the more useful the device will be in the sense of having a wider range and greater flexibility of application to various total circuit configurations. Once the final interconnections are made, the device is, of course, packaged and tested in any suitable conventional manner.

Figure 3:
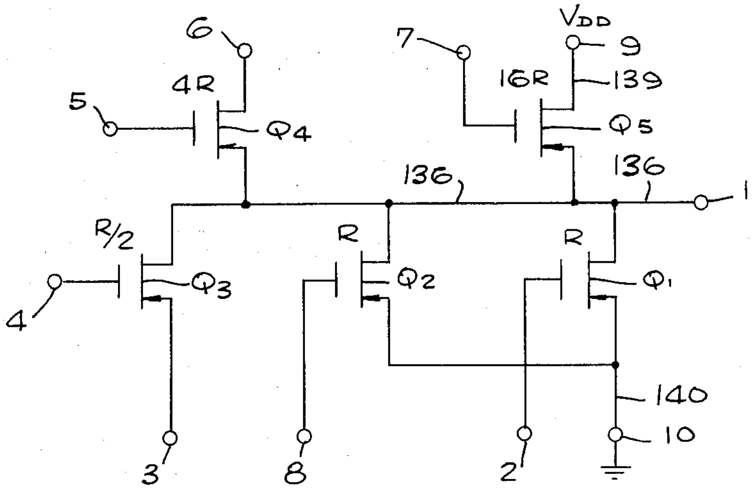
FIG. 3 is a schematic circuit diagram, showing the circuit configuration of one embodiment of a digital cell in accordance with the present invention.
Figure 4:
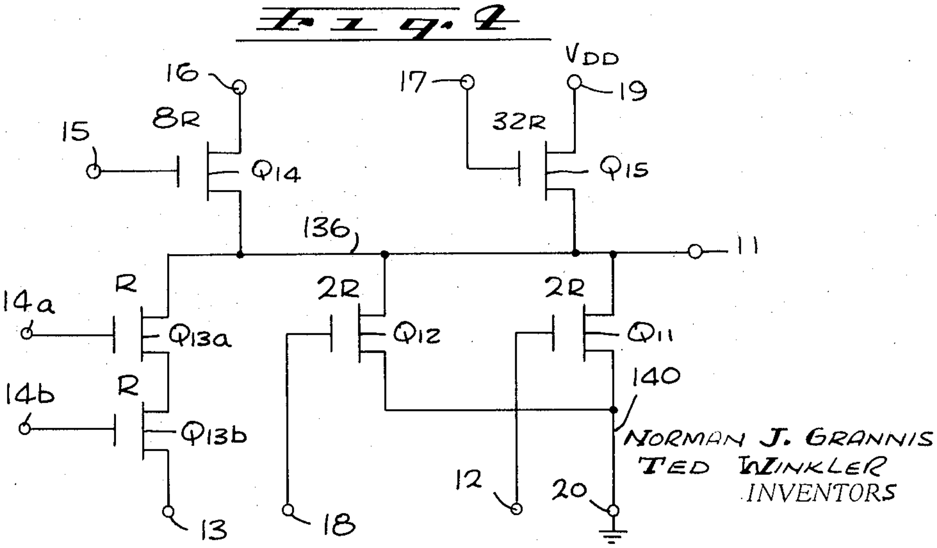
FIG. 4 is a circuit diagram showing the circuit configuration of a second embodiment of a digital cell in accordance with he present invention.
Figure 5:
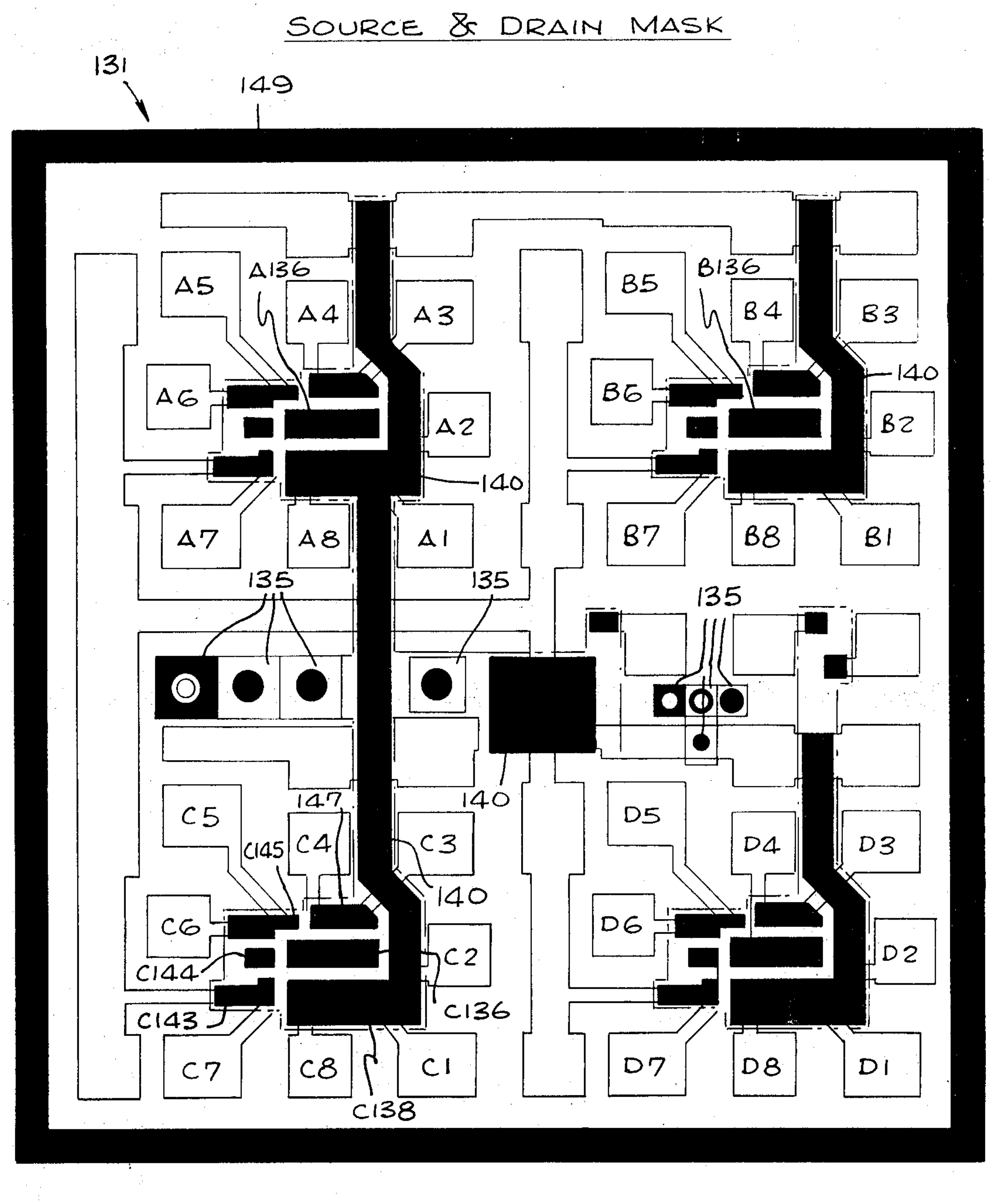
FIG. 5 is a plan view of a mask similar to that used in the exemplary view of FIG. 1(*b*), but showing the actual mask layout of the source and drain forming step in producing a cell in accordance with the circuit diagram of FIG. 3.
Figure 6:
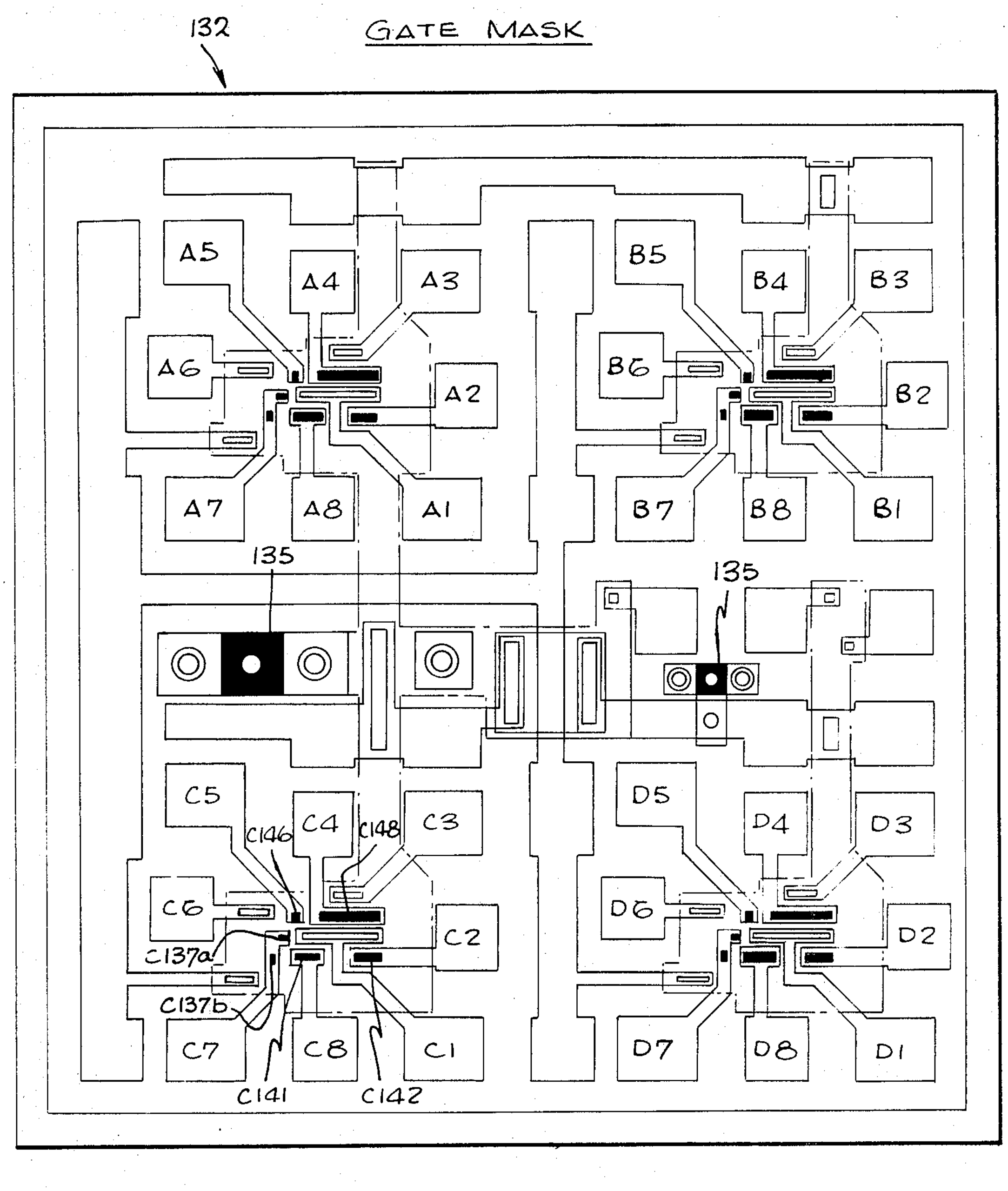
FIG. 6 is a view similar to FIG. 5 but showing the second or gate mask used in the manufacture of the digital cell in accordance with the circuit diagram of FIG. 3.
Figure 7:
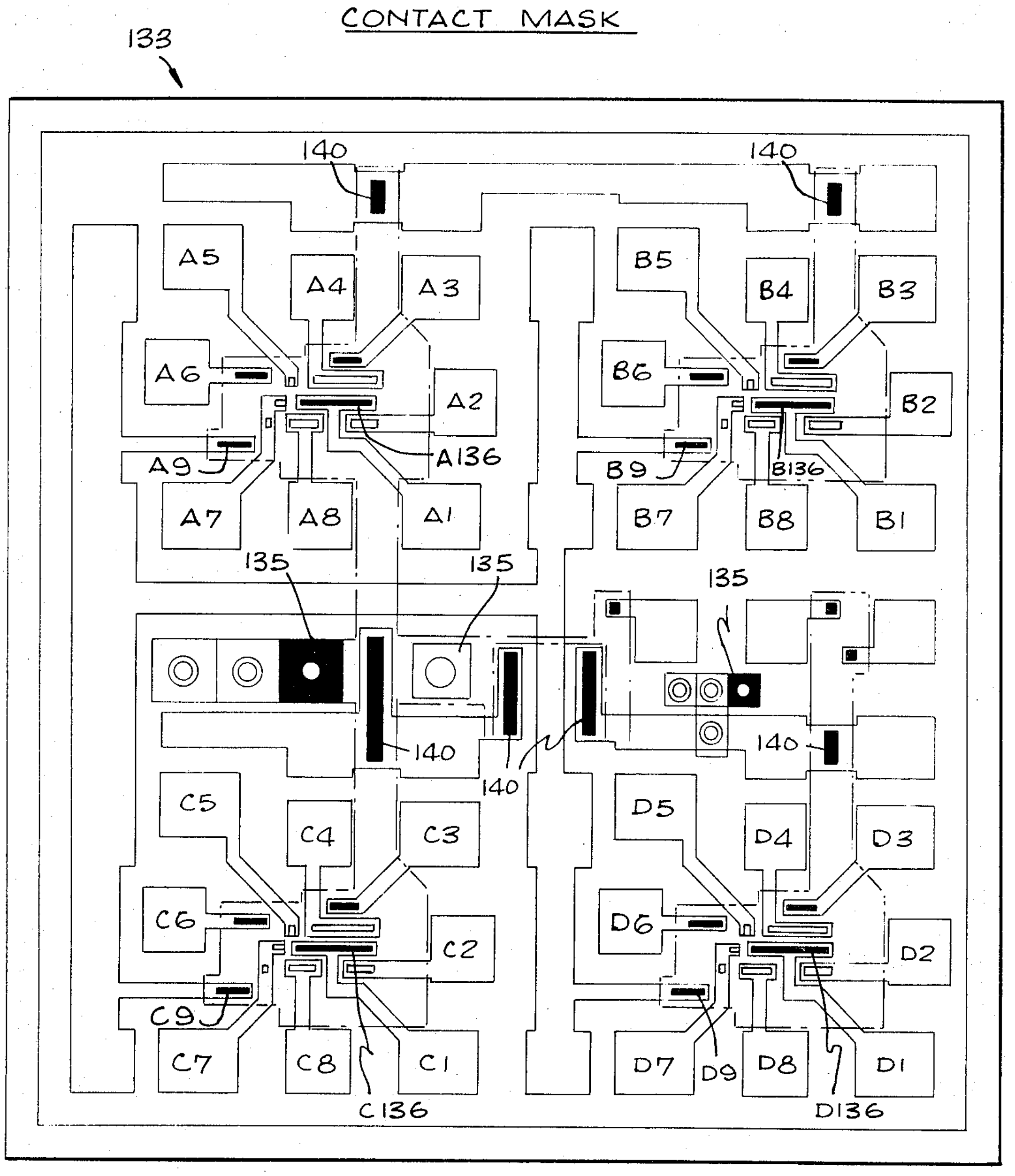
FIG. 7 is a view similar to FIGS. 5 and 6 showing the third or contact mask used in manufacturing a digital cell in accordance with the circuit diagram of FIG. 3.
Figure 8:
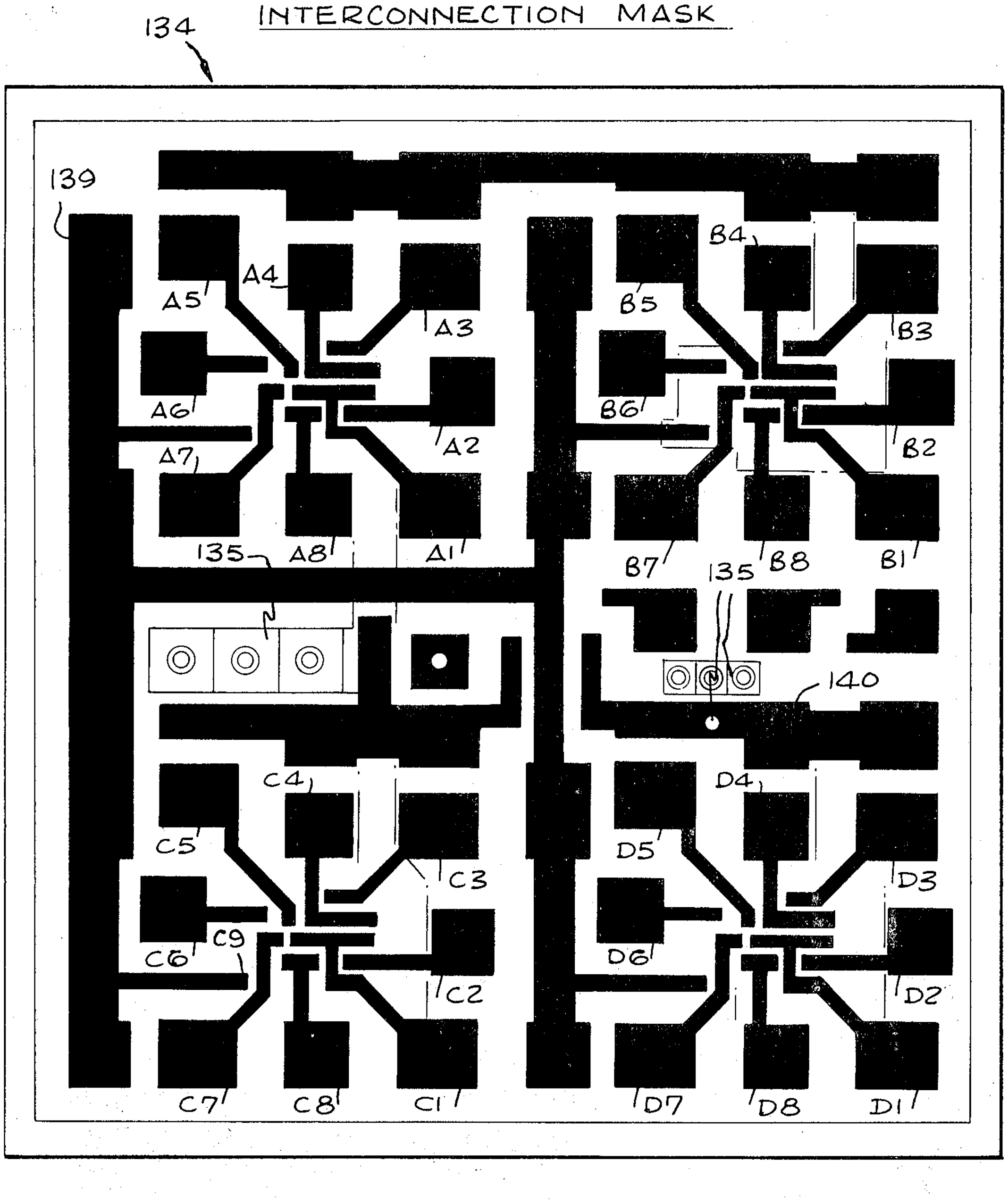
FIG. 8 is a view similar to FIG. 7 but showing the fourth or interconnection mask used in forming a digital cell in accordance with the circuit diagram of FIG. 3.

In FIGS. 3 and 4 there are shown circuit diagrams of two embodiments of the digital cell of the present invention which are formed by an initial interconnection step of the type described in the process illustrated by FIG. 1. The actual masks used to form this circuit configuration are illustrated in FIGS. 5 and 6, 7 and 8. It will, of course, be understood that the mask of FIG. 5 is used in the same manner as the source and drain mask 31 of FIG. 1(*b*); that the mask shown in FIG. 6 is used in the same manner as the gate mask 32 shown in FIG. 1(*e*); that the mask shown in FIG. 7 is used in the same manner as the contact mask 33 shown in FIG. 1(*h*); and that the mask shown in FIG. 8 is used in the same manner as the interconnection mask 34 shown in FIG. 1(*k*). These masks and their use will be considered in greater detail below, but consideration should now first be given to the circuit diagrams of FIGS. 3 and 4.

Turning now to FIGS. 3 and 4, there are shown two possible embodiments of the circuit forming the digital cell. The circuit function is set forth a bit more explicitly and obviously in the embodiment of FIG. 4 which contains one more transistor than the circuit of FIG. 3. Hence, although the same function can be accomplished, in a manner to be explained below, by the circuit of FIG. 3 which in practice is more economical to manufacture, the circuit of FIG. 4 will be first described.

It will be noted that the circuit of FIG. 4 consists of a NOR gate composed of the transistors $Q_{11}$ and $Q_{12}$. This NOR gate is connected in parallel with a NAND gate consisting of the transistors $Q_{13a}$ and $Q_{13b}$ connected in series. The transistor $Q_{14}$ functions as a transfer gate. The NAND gate and the NOR gate are connected in parallel with each other to lead 136 and in series with the transfer gate and with a load device which is here shown as the transistor $Q_{15}$. Lead 136 is thus a node point to which all transistors are connected and is in turn connected to an output terminal identified as 11 in FIG. 4 and as terminal 1 in FIG. 3. It can be shown, as is well known, that all logical digital functions can be implemented through the use of NOR and NAND gates. In accordance with the present invention, the circuit of FIG. 4 would be repeated as many times as possible in a single substrate, and then, in a separate process the available terminals of the circuit so formed would be interconnected as desired to form the parts of a more complex digital machine composed of such digital circuits as are necessary for any particular application. Some of these applications will be shown by way of example below.

The embodiment of the circuit shown in FIG. 3 is arrived at by omitting one transistor from the NAND gate and making appropriate changes in transistor impedance characteristics as will be described below. The circuit of FIG. 4 thus contains a full NAND gate at $Q_{13a}$ and $Q_{13b}$, whereas the circuit of FIG. 3 contains only half a NAND gate at $Q_3$. The circuit is otherwise entirely analogous. Thus, in FIG. 3, transistors $Q_1$ and $Q_2$ form the NOR gate as do transistors $Q_{11}$ and $Q_{12}$ in FIG. 4. In FIG. 3, transistor $Q_3$ forms half of a NAND gate, whereas a full NAND gate is provided in FIG. 4 by transistors $Q_{13a}$ and $Q_{13b}$. In FIG. 3 transistor $Q_4$ forms a transfer gate, whereas this function is served in FIG. 4 by transistor $Q_{14}$. In FIG. 3, transistor $Q_5$ is the load device, whereas this function of load device is carried out by transistor $Q_{15}$ in FIG. 4.

It has in practice been found to be more economical in the techniques used for large scale integration where 500 or 1,000 such cells may be produced on a wafer to use only five transistors per cell as shown in the circuit of FIG. 3 rather than six transistors per cell as shown in the circuit of FIG. 4 and then to use two cells where a full NAND gate is required rather than having the full NAND gate available in a single cell as in FIG. 4. The manner in which two cells of the configuration shown in FIG. 3 can be used to afford a full NAND gate by using the $Q_3$ transistors of two adjacent cells will become more apparent from the exemplary circuit applications to be described below.

Although common node point 136 and ground bus 140 are identified by the same reference character in both FIG. 3 and FIG. 4, it will be noted that the transistors in the circuit of FIG. 4 which have analogous circuit relations to those in FIG. 3 are indicated by reference characters in which the subscript has been increased by 10. Thus, the transistors of the NOR gate in FIG. 3 are $Q_1$ and $Q_2$, whereas the corresponding transistors in FIG. 4 are $Q_{11}$ and $Q_{12}$. Similar notation is used for the other active elements. Additionally, the available terminals of the circuit which in the initial stages of manufacture are in fact electrodes or bonding pads brought out to the surface to be available for later interconnections are indicated in FIG. 3 by reference characters, 1, 2, 3, 4, 5, 6, 7, 8, 9, and 10, respectively, whereas corresponding terminals in the circuit of FIG. 4 are indicated by reference characters 11, 12, 13, 14, (*a* and *b*), 15, 16, 17, 18, 19, and 20.

In each figure there is associated with each MOSFET a figure which is inversely a measure of the relative transconductance or a direct measure of the resistance of the particular device in order to achieve optimum circuit relations.

If we define the transconductance of the MOSFET In the conventional manner as being a measure derived from small signal theory as explained in the Sah article at page 331, and which is essentially a measure of change in drain current produced by a given change in gate voltage for a constant drain voltage, then the values of R shown on the drawing are relative values of the reciprocal of this transconductance. That is to say, if we define R as being equal to $K/G_M$, where $G_M$ is the transconductance measured in mhos and K is a constant (which may, for example, have a value of 0.5 in this particular case), then R is measured in ohms and is a measure of a reciprocal of the transconductance. For convenience, R will be referred to as a normalized unit of resistance, rather than an absolute value stated in ohms, since the point of interest is the relative values of the transconductances of the MOSFETS.

Referring to FIG. 3, it will be noted that R is taken as equal to 1 for MOSFET's $Q_1$ and $Q_2$, these two devices thus having equal transconductances.

In a particular preferred embodiment, the MOSFET $Q_3$ has a resistance value equal to R/2) or one-half that of MOSFET's $Q_1$ and $Q_2$. More generally, although R/2 is a specific preferred value, the MOSFET $Q_3$ should have a value which is in any event less than R. MOSFET $Q_4$ on the drawing is indicated to have a value of 4R. Again, more generally, this device should, in any event, have a resistance value which is greater than R. Finally, MOSFET $Q_5$ is indicated on the drawing as having a value of 16R and more generally this device should have a resistance which is equal to or greater than 10R.

The circuit of FIG. 4 is most easily thought of as derivable from the circuit of FIG. 3 by including the full NAND gate in devices $Q_{13a}$ and $Q_{13b}$ rather than the half-NAND gate represented by device $Q_3$, and at the same time, doubling all values of R which is equivalent to halving all values of transconductance. In particular, it should be noted that the ratio of the load device $Q_5$ to either $Q_1$ or $Q_2$ being equal to or greater than 10 to 1 further enhances the already good immunity to noise inherent in the MOSFET device. This ratio is maintained in either embodiment of the circuit.

As may also be seen from the legends on the drawing, terminal 9 in FIG. 3 and terminal 19 in FIG. 4 is the connection to the power bus voltage, $V_{dd}$. Terminal 10 in FIG. 3 and terminal 20 in FIG. 4 is the connection to the common or ground bus 140 to be shown in greater detail below. Terminal 1 in FIG. 3 and terminal 11 in FIG. 4 are available terminals from which output signal is normally taken. In FIG. 3, terminals 2 and 8 are available for input signal and when these two are used, they form a two-input NOR gate. Terminal 4 of $Q_3$ can be used in the single cell of FIG. 3 as a third input, making a three-input NOR gate.

However, as noted above, terminal 3 of the device $Q_3$ can be connected to the corresponding terminal 3 of the $Q_3$ device in an adjacent individual cell so that terminal 4 of each of the two cells thus connected forms the two inputs of a full NAND gate. $Q_3$ can also be used as a low power buffer amplifier as indicated by its relative low resistance value, i.e., high $g_m$ .

MOSFET $Q_4$ in FIG. 3 (and $Q_{14}$ in FIG. 4) normally function as a transfer switch or gate. That is to say, if the input/output terminals of a storage device or a flip-flop circuit are connected to terminal 6, then input is passed into or read out of such device only when a signal applied to terminal 5 renders MOSFET $Q_4$ conductive. In the absence of such signal, the buffered device storing the information will remain in an unchanged state. MOSFET $Q_4$ can also be used as a pull up resistor for a high power circuit. This is accomplished by paralleling $Q_1$, $Q_2$, and $Q_3$ to provide a low impedance switch to ground, while at the same time using the 4R transistor as the load or pull up resistor rather than the 16R transistor. In this way, the ratio of impedances is maintained constant at 16 to 1, but the absolute values of the impedances are reduced to one fourth their normal value.

When the circuit of FIG. 3 is considered independently of other duplicate circuits, it is basically a three-input NOR gate with the signal inputs being applied to terminal 2, 8, and 4 and with terminals 3 and 10 being grounded and additionally having the transfer gate function provided by $Q_4$, the control of which is at terminal 5 and the output from which is at terminal 6. If the device $Q_4$ is to be used solely as an additional resistor, terminal 6 is of course connected to $V_{dd}$, whereas if $Q_4$ is to be used as a transfer, terminal 6 is to be connected to another transistor. In practice, the above manufacturing methods have been found to yield four such digital cells per chip with approximately 250 chips to a wafer so that a normal production run wafer will contain 1,000 such digital cells, each comprising five MOSFET's as shown in FIG. 3.

As noted above, the masks used for production of a digital cell chip having the circuit configuration shown in FIG. 3 by means of the manufacturing process shown in connection with FIG. 1 are shown in FIGS. 5, 6, 7, and 8. A manufacturing process entirely analogous to that described in connection with FIG. 1 is carried out using these masks. Of course, it will be understood that conventional equipment for repetitive projection and stepping of the photolithographic images is used so as to produce not one but a large number of cells on a given wafer. Otherwise, the mask 131 of FIG. 5 is used in the same fashion that mask 31 of FIG. 1(*b*) was used to form the layout for the source and drain forming diffusion step. Similarly, the mask 132 of FIG. 6 is used in the same fashion that mask 32 of FIG. 1(*e*) is used to position the gate electrode. Next, the mask 133 of FIG. 7 is used in the same fashion that mask 33 of FIG. 1(*h*) was used to prepare the source and drain contact areas. Finally, the mask 134 of FIG. 8 is used in the same fashion that mask 34 of FIG. 1(*k*) was used to prepare the interconnection layout.

It will be noted that the mask in each of FIGS. 5, 6, 7, and 8 are formed by selectively rendering opaque different portions of the same basic pattern or design layout which is indicated in each figure by single line outline. The portions of this basic pattern which are made opaque for each of the different masks is the only differentiation between them as must necessarily be the case if they are to achieve the necessary registration. The opaque portions of each mask are shown in solid black. The single line outlines, of course, do not exist in the actual mask but are shown merely to clarify the layout.

Certain portions of each of the masks have no function in forming circuit elements but are used merely as indexing elements to achieve photographic registration so as to correctly position the rest of the mask with respect to previous and subsequent exposures of other masks. These registration index areas are indicated generally by the reference character 135 in each of the four masks.

It will be noted particularly from FIG. 8 that there are four digital cells of the type shown in FIG. 3 having numbered terminals coming out to bonding pads, the opaque areas in the mask of FIG. 8 are used for formation of these terminals. The terminals of the first digital cell in the upper left hand corner are numbered A-1 through A-8, respectively and correspond circuit-wise to terminals 1, 2, 3, 4, 5, 6, 7, and 8 of the circuit of FIG. 3. The corresponding terminals of the second digital cell are indicated at B-1 through B-8. The corresponding terminals of the third digital cell are indicated at C-1 through C-8 and lie generally in the lower left-hand corner of the chip. Finally, the terminals of the fourth digital cell are indicated at D-1 through D-8 and lie generally in the lower right-hand corner of the mask of FIG. 8.

The physical location of the separate MOSFET's is best visualized by considering the gate mask of FIG. 6 wherein the opaque elements, as noted above, are used to form the gate electrode in the same manner that mask 32 of FIG. 1 is used. It will be noted that in each digital cell there are actually six opaque areas rather than 5. This is due to the fact that the 16R transistor is actually composed of two 8R transistors connected in series having gates 137(*a*) and 137(*b*). This is done to permit all channel spacing to have the same dimensional length with only width varying in order to alter resistances. This improves manufacturing control over tolerances. Thus, in FIG. 5, the opaque area C136 forms the common node or connection point, manufactured as a common diffusion area, for all five transistors of the C digital cell. The horizontally extending portion C138 of the ground bus 140 serves as the source area for the $Q_1$ and $Q_2$ transistors of this C group. It will be noted from FIG. 3 that, circuitwise, their sources are in parallel. Forming them as a single area, of course, eliminates connection probelms. It will be noted from FIG. 5 and 6 that areas, C141 and C142 form gates above the channels separating C138 from common diffusion area C136. As noted above, the 16R transistor $Q_5$ is formed by connecting in series the two source areas C143 and C144 to common diffusion area C136. The gate areas C137(*a*) and C137(*b*) form gates above the channels between their areas and the common diffusion area thus permitting all channels to have the same length as noted above. Finally, source area C145 is separated from common diffusion area C136 by the channel under gate C146 to form the 4R transistor $Q_4$, and source area C147 is separated from common diffusion area C136 by the channel under gate C148 to form the R/2 transistor $Q_3$.

In FIG. 5 it will in particular be noted that the channel areas formed between the centrally located common diffusion area C136 and the peripherally disposed source and drain areas C138, C142, C144, C145 and C147 have equal lengths with only channel widths varying to control resistance in accordance with the earlier discussed theoretical design criteria. This is done so that any microscopically small misalignment of masks will produce the same percentage change of resistance in each transistor. Such an equal percentage change is of course desirable since the proper circuit operation depends upon the ratios between the resistance values of the MOSFET's rather than upon critically exact absolute values.

The common connection is indicated by the reference character 136 in FIG. 3 on the output lead connected to the terminal 1. In FIG. 5, the common connection actually formed as a common diffusion area is indicated in the respective chips by reference characters A136, B136, C136 and D136. It will be obvious from a comparison of the source and drain masks of FIG. 5 with the interconnection mask of FIG. 8 how the common diffusion area is connected to the number 1 terminal in each of the individual cells.

Referring again to FIG. 5, the reference character 140 is used to indicate the common ground bus for each cell. A similar reference character is applied to the conductor leading to terminal 10 in FIG. 3, and to the ground bus in FIG. 9. The separate ground bus areas formed by the diffusions outlined in FIG. 5 are connected together by crossunders as will be obvious from the areas also labeled 140 in the interconnect mask of FIG. 8. Finally, of course, connection is made to the ground bus as indicated in the contact mask.

The power supply $V_{dd}$ is applied to terminal 9 in FIG. 3, which in turn is shown connected to conductor 139. This power supply in the actual device is best seen in FIG. 8 where the H shaped bus 139 will be seen to have a small lead branching off to each digital cell.

The internal structure of the digital cell formed from the masks shown in 5, 6, 7, and 8 is thus seen to be such as to produce an implementation of the circuits shown in FIG. 3 in each of the four quadrants of the chip produced by the masks. The border area indicated by the reference character 149 in FIG. 5 forms an outline for each chip if it is desired to dice the wafer into separate chips. Within each chip, in addition to power supply terminals and ground terminals, there are the four digital cells indicated by the available terminal notation in FIG. 8. That is to say, the terminals A-1 through A-8, formed by the opaque areas so labeled in FIG. 8 are in fact the terminals 1, 2, 3, 4, 5, 6, 7, and 8, shown in FIG. 3. This same relationship is repeated for each of the other B, C, and D quadrants, so that in each digital cell brought out by the last manufacturing step, the eight available terminals serve the functions which are indicated by terminals 1, 2, 3, 4, 5, 6, 7, and 8 in FIG. 3. The device with these available terminals forms the digital cell of the present invention which, as noted, can be further interconnected to form a large number of more complex circuits. The advantage of the present circuit is that cells of this type can be mass produced in large quantity for economy and reliability so as to leave only the final interconnection step to be performed at the point of specific decision as to what particular circuit is desired.

Figure 9:
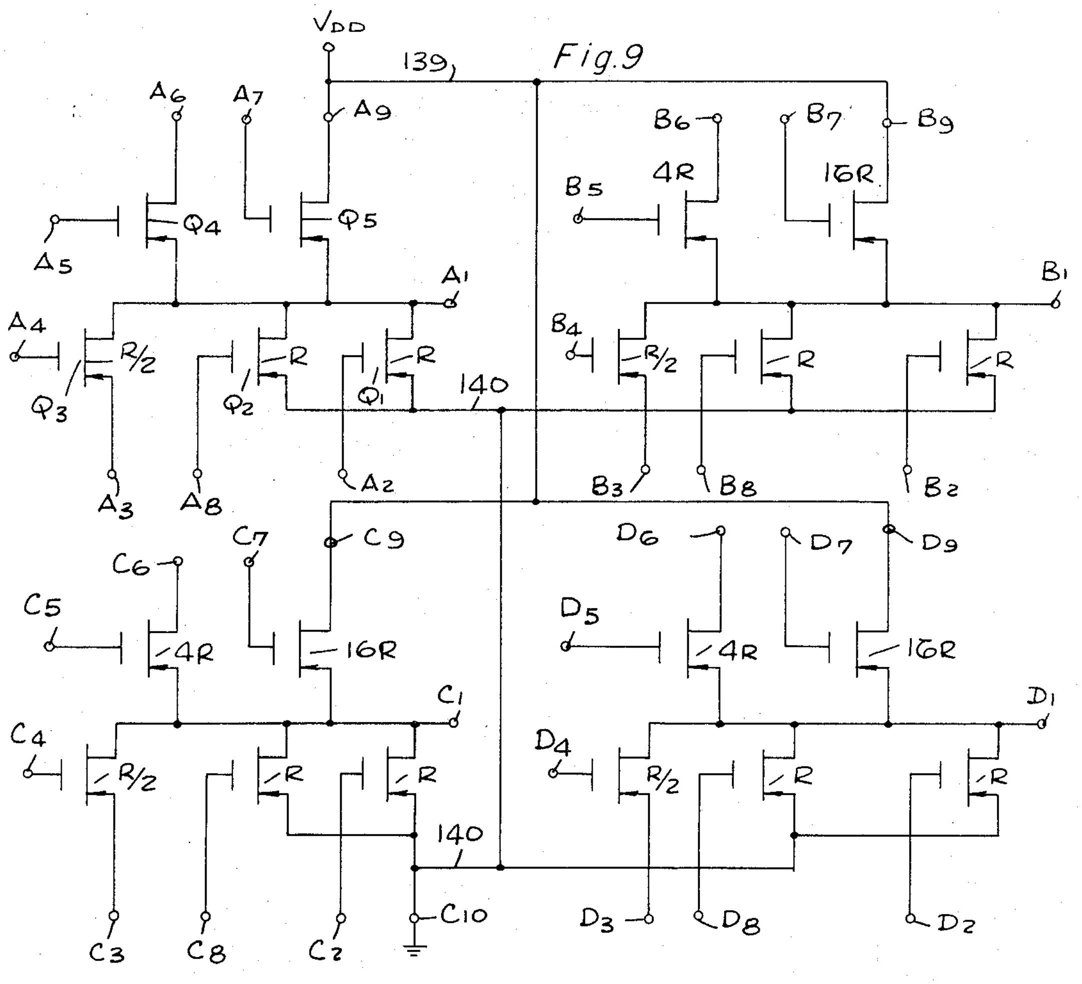
FIG. 9 is a circuit diagram of a four cell chip of the type manufactured by the use of the masks shown in FIGS. 5, 6, 7, and 8, wherein four circuits of the type shown in FIG. 3 are interconnected on a single chip.

The complete circuit diagram of a chip containing four digital cells is shown in FIG. 9. In particular, it can be seen from this diagram how the common power supply bus 139 connects to the terminals of each of the four digital cells. Also, the common ground bus 140 previously shown in FIG. 5 is indicated by the same reference character in this schematic.

Also, in FIG. 9, the available input terminals identified in each mask plan drawings by A-1, A-2, B-1, B-2, etc. are indicated by the corresponding reference characters in this four cell circuit diagram. It will in particular be noted that the common power supply bus bar 139 connects all of the number 9 terminals together and that the common ground 140 connects all of the number 10 terminals together. Otherwise, in each cell configuration, the terminals numbered respectively, 1, 2, 3, 4, 5, 6, 7, and 8 are brought out to bonding pads which can be seen most clearly in the mask of FIG. 8. These bonding pads are then available for further interconnections either by ball connecting lead wires between them or by further photolithographic metallization techniques.

In order to afford a suggestion of the flexibility and possible circuit uses of the digital cell described above, examples are shown in FIGS. 10 through 18 of the manner in which the cell may be connected to form various well-known circuit configurations. Since each of the type of circuit illustrated in these figures is per se well known in the art, no detailed explanation of circuit current paths or the like will be given. Associated with each circuit there is, however, a reproduction of a photograph of oscillograph traces showing wave forms for the various inputs and outputs indicated on the circuit diagram. From the illustration of the manner in which the circuits of FIGS. 3 or 9 are connected and from the accompanying wave form patterns, it will be obvious what the function and mode of operation of the circuits is.

Figure 10B:
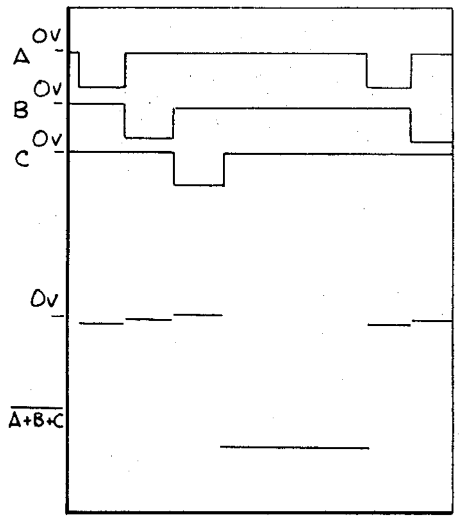
FIGS. 10 through 18 are each circuit diagrams illustrating various exemplary circuit configurations which may be formed from the digital cell previously described by appropriate interconnections. Associated with each figure is a graph showing voltage plotted as a function of time for various inputs and outputs to illustrate the function of the circuit.
Figure 10A:
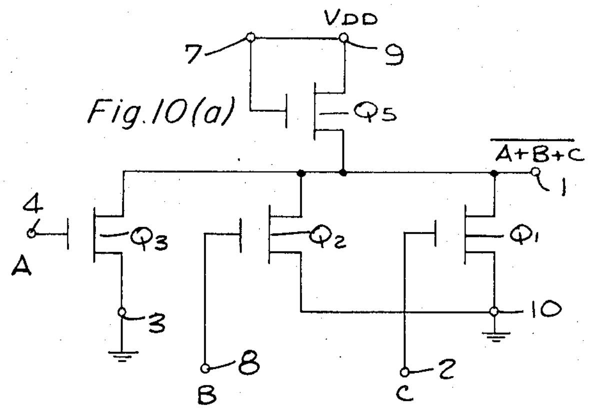

For example, in FIG. 10, (*a*) there is shown the manner in which a single digital cell of the type shown in FIG. 3 can be used as a 3 input NOR gate. In this circuit the MOSFET $Q_4$ is not utilized. Terminals 3 and 10 are connected to ground and terminals 7 and 9 are connected to the power supply $V_{dd}$ so that $Q_5$ is essentially functioning as a fixed value load resistor. Input signals A, B, and C are applied at terminals 4, 8, and 2, respectively and an output signal appears at terminal 1. In the wave form graph FIG. 10(*b*), the signal pattern A, B, and C, applied to terminals 4, 8, and 2, respectively, is shown opposite these letters near the top of the graph, whereas the output $\overline{A+B+C}$ is shown at the bottom of the graph. Standard symbolic logic notation is used to describe the signals. Thus, it will be observed that when a negative going pulse is applied to any one of the A, B, or C inputs, there is no signal output at the terminal 1, whereas, when there is no input singal the output at terminal 1 produces a negative going pulse. This is the usual manner of functioning of a 3 input NOR gate. In this instance, of course, a signal at any one of the terminals A, B, or C will render the MOSFET controlled thereby conductive, that is $Q_3$, $Q_2$, or $Q_1$ will conduct and will thereby place the terminal 1 at ground potential. When no such signal is applied to any one of terminals 4, 8, or 2, then none of the MOSFET's $Q_3$, $Q_2$, or $Q_1$ is conductive and their parallel combination in series with $Q_5$ simply acts as a voltage divider. Optionally, pin or terminal 7 may be gated or returned to a variable $V_G$ voltage to optimize power/speed or noise immunity/speed trade-offs. Note that terminal 4 represents the equivalent of two input loads due to the increased capacitance of the larger geometry necessary to provide the R/2 resistance of the device by comparison with the R resistance of $Q_1$ and $Q_2$. In the particular circuit from which the test results were obtained, the voltage $V_{dd}$ was equal to −27 volts.

Figure 11A:
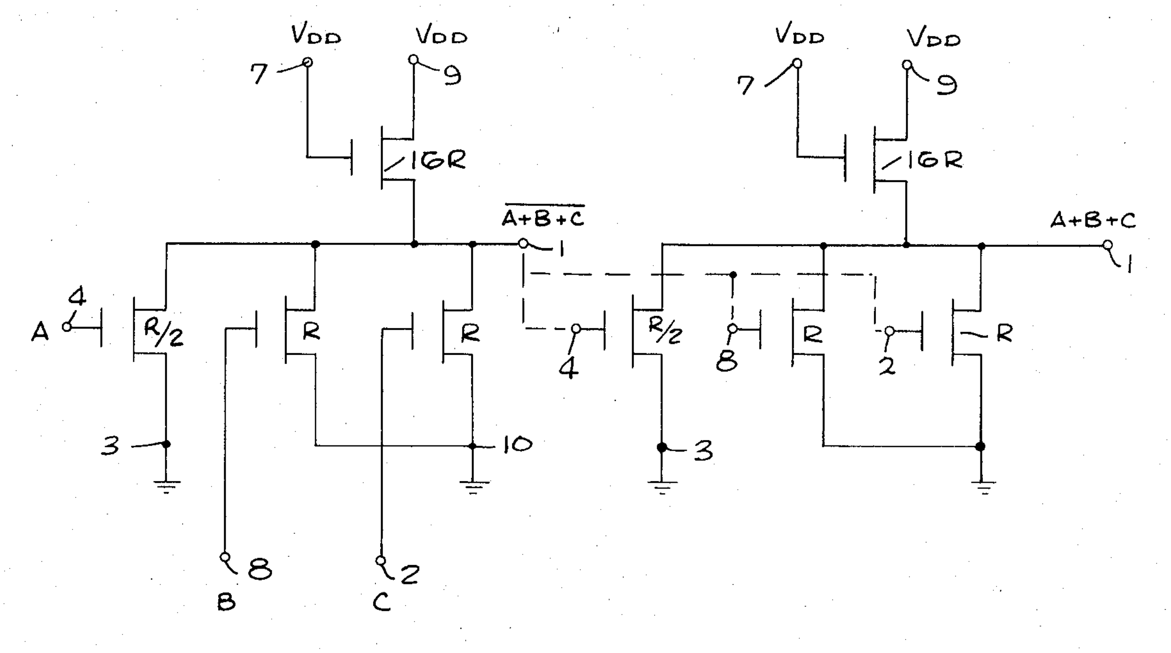
Figure 11B:
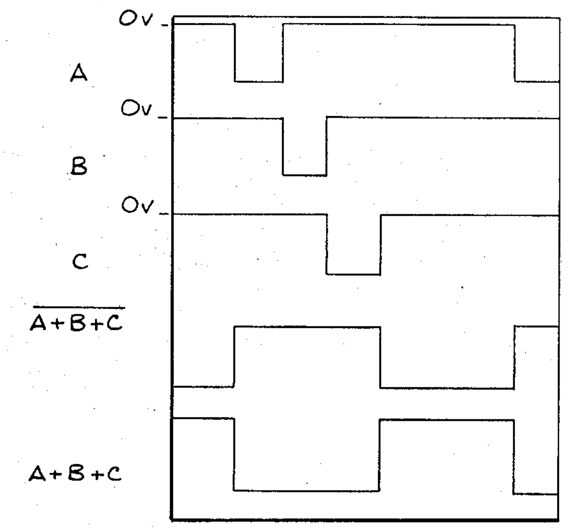

In FIG. 11(*a*) there is a similar illustration showing how two of the digital cells can be interconnected to provide a three input power OR cell. The circuit shown has 4 times the output drive capability of the standard gate. Again, the above defined terminal reference characters have been applied to appropriate terminals and the logic of the operation indicated by the standard notation of A, B, and C at the three inputs and A + B + C indicated at the fianl output terminal 1. The dashed lines are used to indicate interconnections of conductors between the available terminals of the pre-formed digital cells described above. Thus, output terminal 1 of the first cell is connected to terminals 4, 8, and 2 of the second cell. The number 7 and 9 terminals in each cell are connected to the power supply $V_{dd}$, whereas the numbers 3 and 10 terminals of each cell are connected to ground. Inputs A, B, and C are applied respectively to terminals 4, 8, and 2 of the first cell. The NOR gate output from gate 1 of the first cell is applied as noted above, to terminals 4, 8, and 2 of the second cell producing an OR output A + B + C at terminal 1 of the second cell. The oscilloscope pattern of the inputs and outputs is shown in the graph FIG. 11(*b*).

Figure 12A:
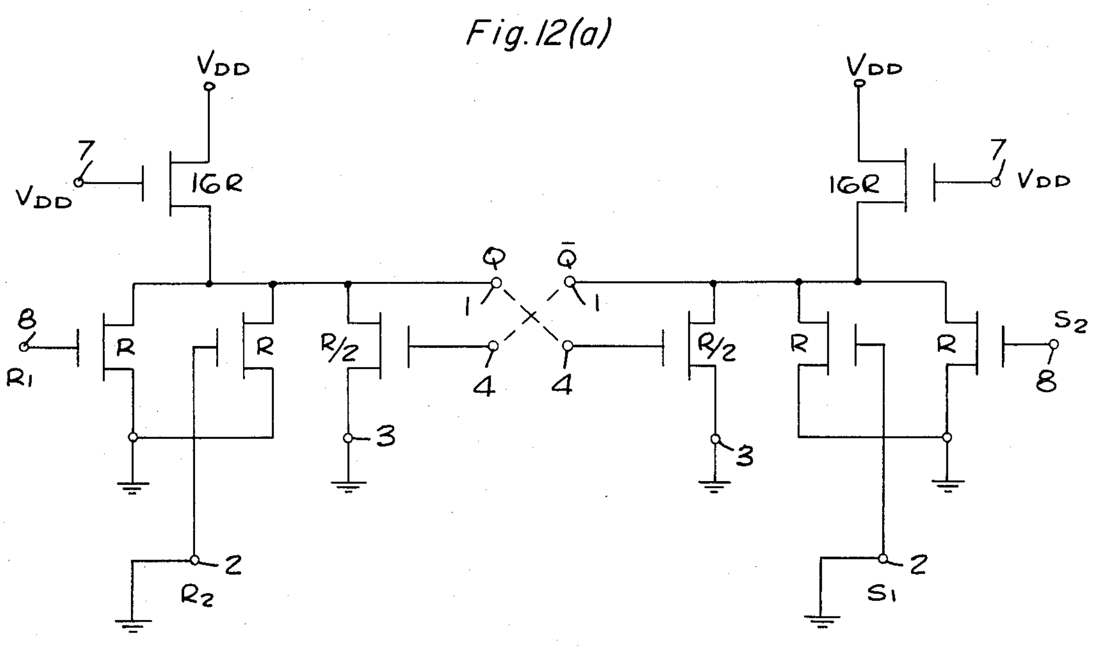
Figure 12B:
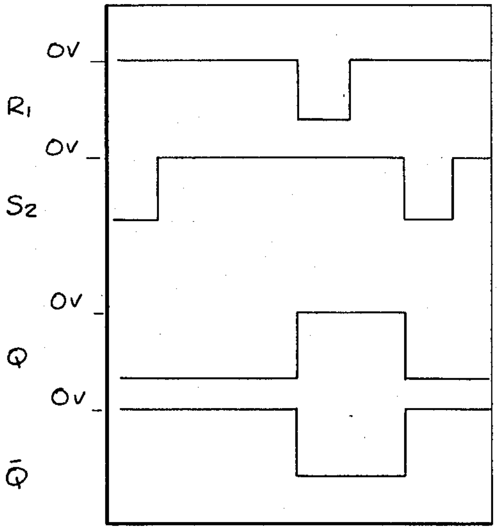

In FIG. 12(*a*) there is shown the manner of connecting two digital cells of the present invention to form an R-S flip-flop circuit. The wave form patterns of inputs at R-1 and S-2 and outputs at Q and $\overline{Q}$ are illustrated in the accompanying graph FIG. 12(b). The use of the R/2 elements for cross-coupling by connecting the number 1 and 4 terminals of the opposite cells increases the immunity of the device to noise. The active devices, it will be noted, are identified only by their resistance values, since this is the factor of significance and since it will be obvious from comparison of the circuit with FIG. 3 which devices and terminals are intended.

Figure 13A:
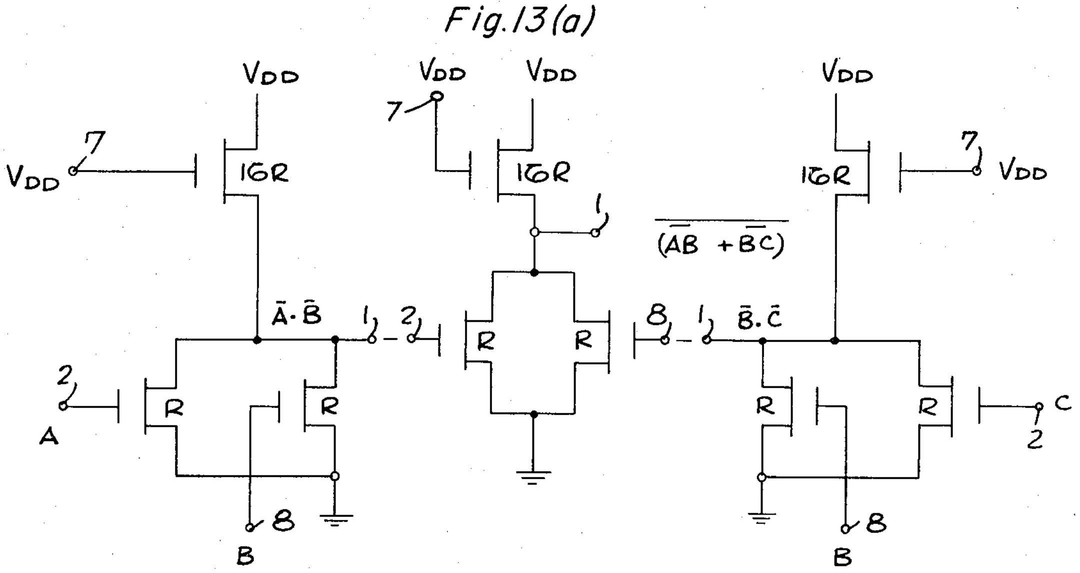
Figure 13B:
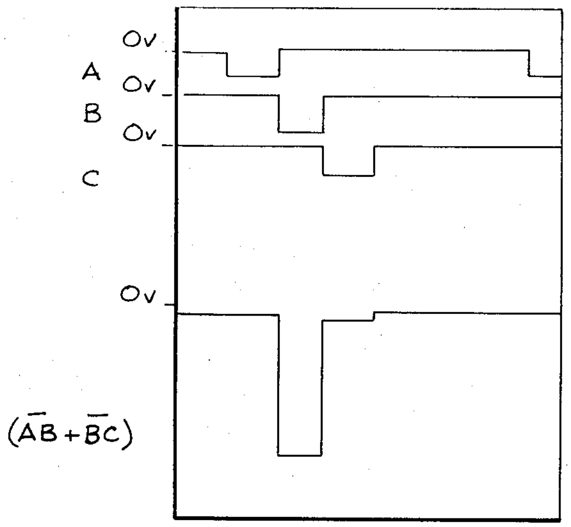

In FIG. 13(*a*) there is shown the manner in which three of the digital cells are interconnected to form an exclusive OR circuit. Again the dashed lines are used to indicate conductive connections between terminals of different cells. Thus, terminal 1 of the first cell is connected to terminal 2 of the second cell, whereas terminal 8 of the second cell is connected to terminal 1 of the third cell. The logical functions appearing at each of the terminals are indicated by standard symbolic logic notation. The graph of inputs A, B, and C wave forms are included in the FIG. 13(*b*). Input A is applied to terminal 2 of the first cell, input B is applied to terminal 8 of the first and third cell, and input C is applied to terminal 2 of the third cell. Output appears at terminal 1 of the second or middle cell. This output is plotted in the lower portion of the graph.

Figure 14A:
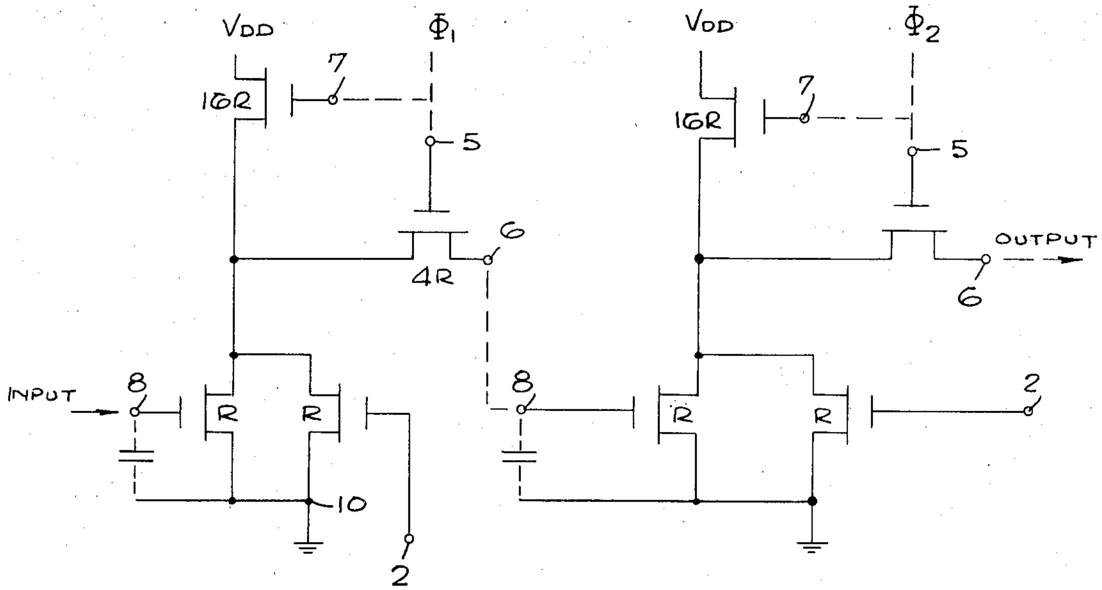
Figure 14B:
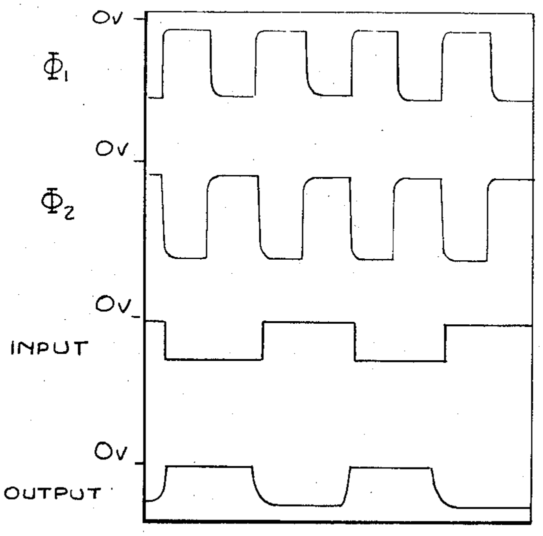

In FIG. 14(*a*) there is illustrated the manner in which two digital cells are interconnected to form a dynamic shift register. Again a similar notation has been used wherein terminal numbers are those derived from FIG. 3, resistance values of the active devices are stated and interconnections between the cells are shown by dashed lines. It will be noted that in this circuit, the transfer gate $Q_4$ of FIG. 3 shown here as having a value 4R is used in its storage or buffering function. A clock-pulse $\Phi_1$ is applied to terminals 7 and 5 of the first circuit, the wave form being shown in the graph FIG. 14(*b*). A second clock pulse $\Phi_2$ 180° out of phase with the first is applied to terminals 5 and 7 of the second cell. Input is applied at terminal 8 of the first cell which is shown connected through a capacitance to the ground bus 10. This capacitance is actually the parasitic capacitance of the gate of the input MOSFET itself, but it is shown since it is necessary to circuit operation. Output from the first buffer is taken from terminal 6 of the first digital cell and applied to the input terminal 8 of the second digital cell, which is also connected through a parasitic capacitance to ground. The final output is taken from terminal 6 of the second cell. The output terminal 2 of the second cell can be used for parallel loading if desired.

Figure 15A:
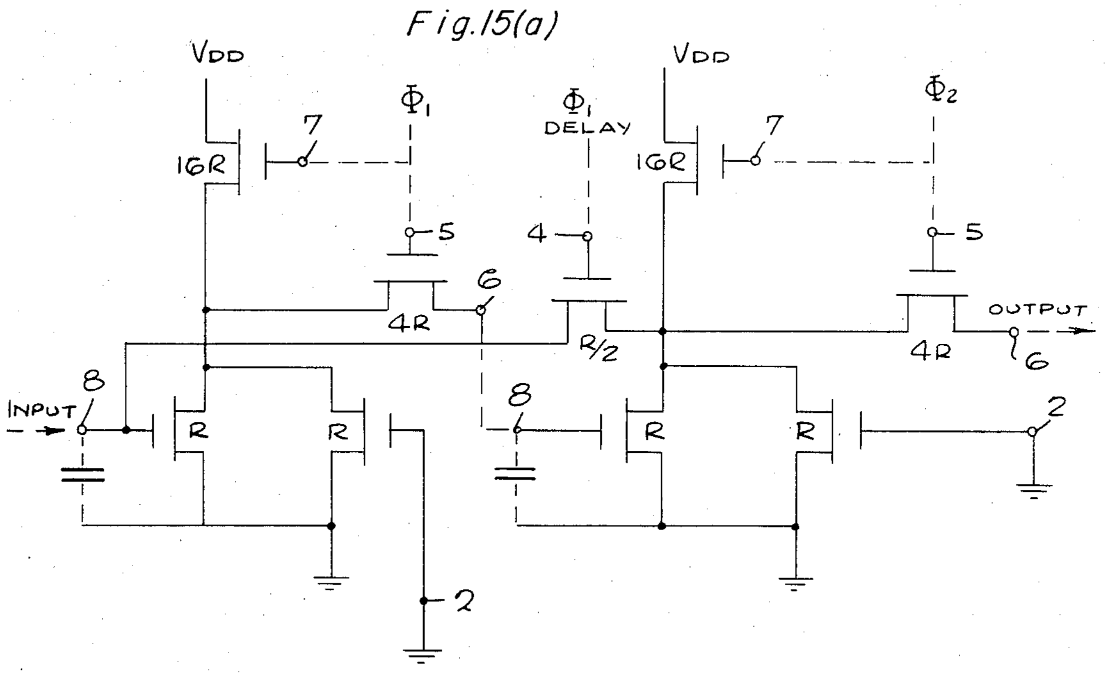
Figure 15B:
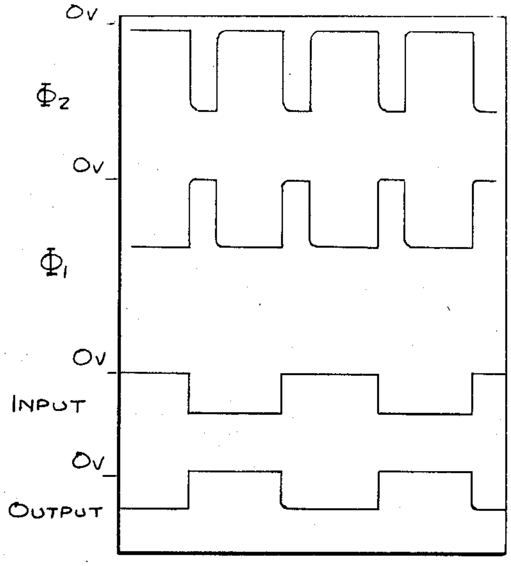

In FIG. 15(*a*) there is shown a similar dynamic shift register but with the addition of a delayed clock or a latch pulse "$\Phi_1$ delay" which is applied as shown in FIG. 15 to terminal 4 of the R/2 transistor. The addition of the latch pulse delay transistor enables the shift register to operate down to DC level. Without it, the register wll not operate at frequencies below 1 kHZ. In other words, the latch pulse delay produces a static shift register rather than a dynamic shift register.

Figure 16A:
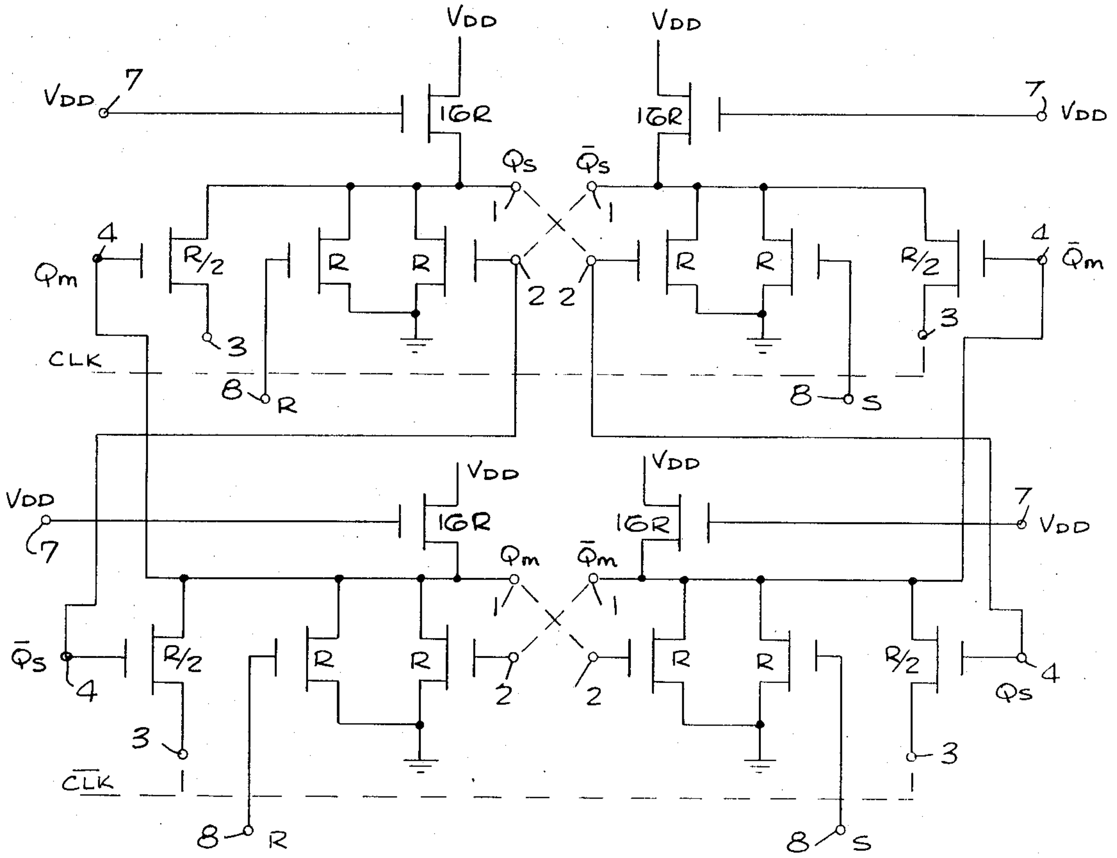
Figure 16B:
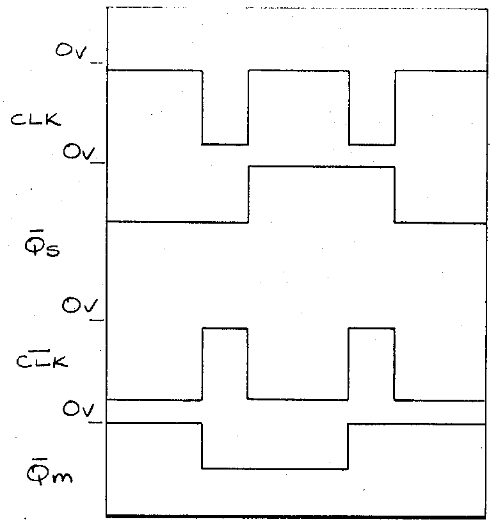

In FIG. 16(a) there is shown a two flip-flop binary using four digital cells interconnected as shown. Again, resistances are indicated by their relative values, connection between cells indicated by dashed lines, and the standard notation for terminals which has been earlier adpated is used. The clock input is applied to terminals 3 of two of the cells and is shown at the top of the graph 16(*b*). The $\overline{Q}_S$ output signal appears at terminal 1 of the upper cell and is shown next in the graph. It is applied to the number 3 terminals of the lower pair of cells. The $\overline{Q}_M$ signal is shown at the bottom of the graph and appears at terminal 1 of the lower right-hand cell. The clock and not clock voltages must have output impedances equivalent to R/2 or less to ground.

Figure 17A:
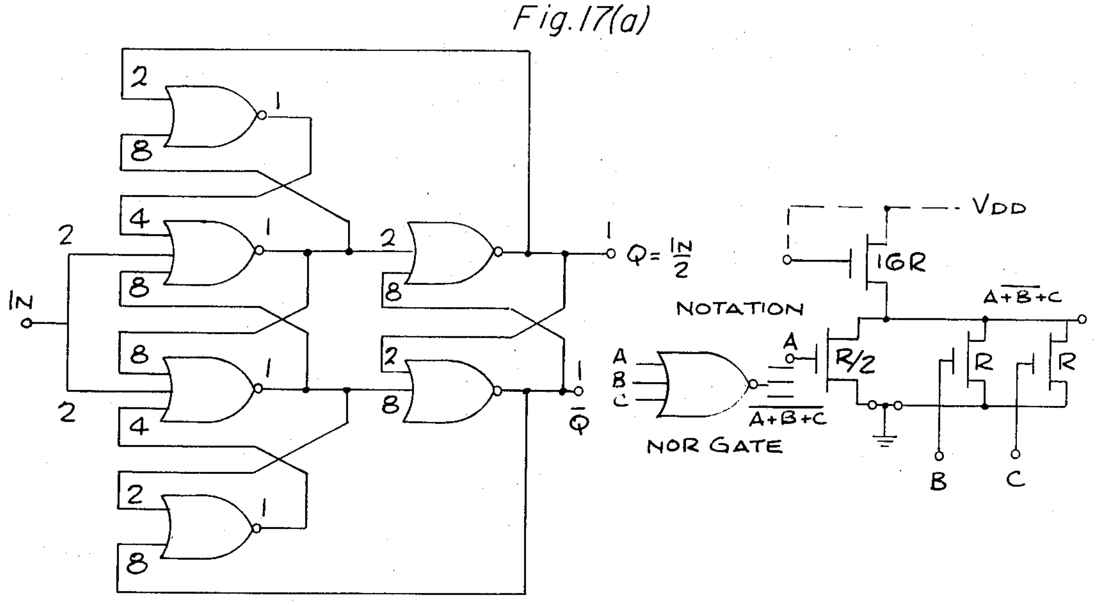
Figure 17B:
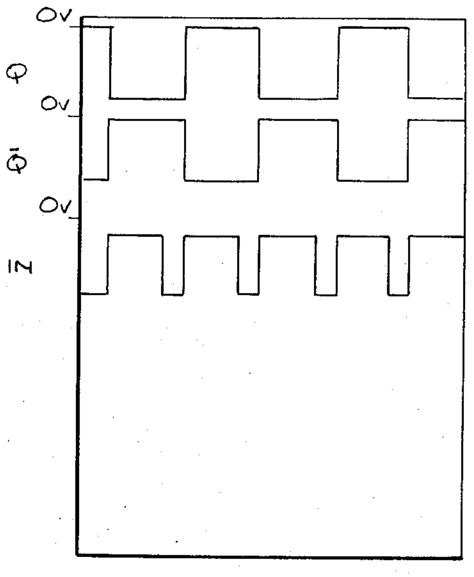
Figure 17C:
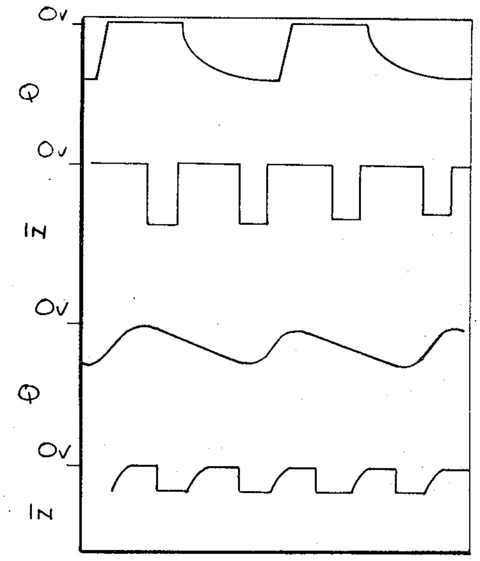

In FIG. 17(*a*) there is shown the circuit diagram for a three flip-flop binary using six cells. In this figure, the NOR gate symbol at the lower right of FIG. 17(*a*) has been used to indicate a NOR gate having three inputs, A, B, and C, formed from one digital cell as indicated in the bracketed explanations labeled "notation." The six NOR gates are interconnected as shown in the main circuit diagram of FIG. 17(*a*). Input is then applied at the terminal labeled "in" and outputs are taken at Q and $\overline{Q}$ from number 1 terminals of the two output digital cells. It should be noted that the input signal required no specified rise time or pulse width and that operation is not dependent upon capacitor storage techniques.

In a particular circuit which was fabricated and from which the wave forms patterns were derived by oscilloscope techniques, the highest output amplitude on the graph at the highest frequency was 500 kHZ. The scale on the oscilloscope was 1 volt equal to 10 volts and the time equal to one microsecond. In the lower portion of the graph of FIG. 17(*c*) the highest operating frequency was 1.2 MegaHertz and the scale was 1 volt equals 10 volts and the time was 0.5 microsecond.

Figures 18A, 18B:
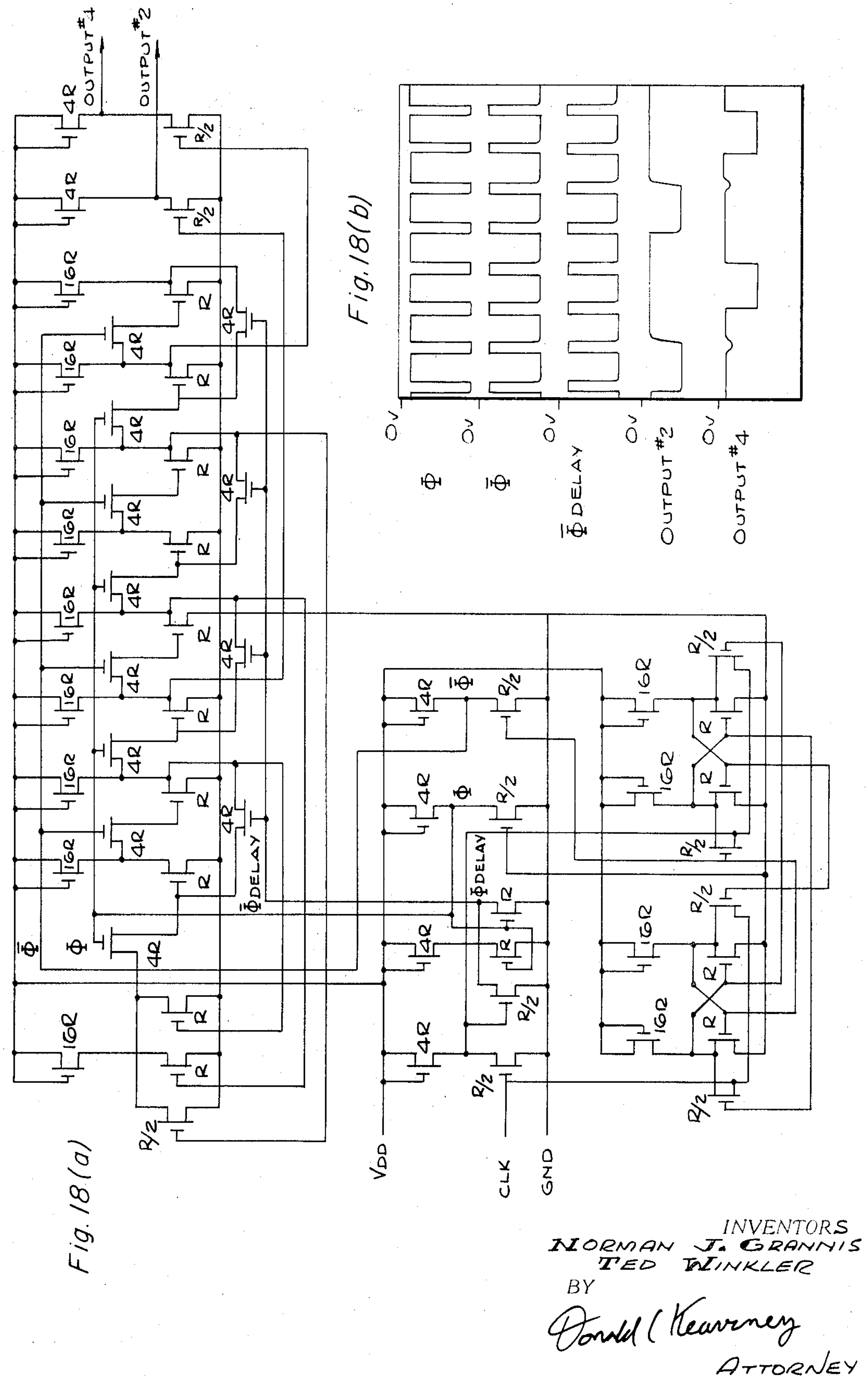

In FIG. 18(a) there is shown the circuit diagram for a four bit ring counter using 19 digital cells and from which 58 of the available transistors are used. In the graph FIG. 18(*b*) accompanying this figure, clock inputs are shown at $\Phi$ and $\overline{\Phi}$ (which is 180° out of phase with $\Phi$ ) and $\overline{\Phi}$ delayed. Outputs number 1 and number 2 are shown in the graph and are taken from the point indicated by corresponding legend in the circuit diagram. Otherwise the symbolism is that which has been used in previous circuit explanations except that all conductors are shown in solid line.

It will, of course, be understood that the circuits shown in FIGS. 10(*a*) through 18(*b*) are given by way of illustration and example only and that many other well-known circuit configurations can readily be formed using wafers containing a plurality of digital cells of the type described herein. In addition to AND, OR, and NOR gates, DC binary, dynamic shift register, and RS flip-flop, master/slave, half adders, inverters, buffers, memories, and associative memories are readily formed by techniques which will be obvious to those skilled in the art from the teaching herein. In fact, all of the elements necessary to build a complete general purpose digital computer can be formed from the digital cell of this invention. The general circuit principles which would guide the use of the cells for constructing a general purpose computer are well known and are discussed in many prior art publications. Reference may be made, however, to the September 1966 issue of "Scientific American" magazine published by Scientific American, Inc., New York, New York. The entire issue is devoted to information processing. Reference is also made to two books by R. K. Richards, both published by D. Van Nostrand Co., New York, New York, one entitled "Arithmetic Operation in Digital Computers" (1955) and the other entitled "Digital Computer Components and Circuits" (1957). The digital cell disclosed herein is an improvement over the circuit components and embodiments disclosed therein, but can, of course, be used in the classical circuit configuration logic disclosed therein in describing general purpose computation equipment.

In particular, the circuit configuration disclosed for the digital cell and the impedance relationships between the Metal Oxide Silicon Field Effect Transistors in that circuit relationship has been found to produce a digital cell or logic stage of a high degree of universality and flexibility of application. The consequent gain in reliability and economy of manufacture makes possible from a practical point of view a higher degree of system complexity that as heretofore been attainable.

While specific preferred embodiments and illustrations of the invention have been described herein, it will be understood that they have been given by way of example only and that the invention is capable of many other specific embodiments and modifications and is defined solely by the following claims.

We claim:

1. An integrated circuit microelectronic device having a plurality of Metal Oxide Silicon Field Effect Transistors formed in a common substrate of one conductivity type and grouped into standard cells, each cell comprising:

a common diffusion region of another conductivity type formed in the substrate;

first, second, third, fourth, and fifth diffusion regions of said another conductivity type formed in and arranged peripherally around said common diffusion region, each equally spaced therefrom, thereby defining a channel region therebetween each of equal length, said first and second region being integrally continuous;

a layer of dielectric material disposed over the substrate including that region above each of said channel regions;

first, second, third, fourth and fifth gate electrodes deposited on said dielectric layer and each having a first portion disposed above the channel region of a respective one of said diffusion regions, and a second portion constituting a terminal bonding pad whereby, respectively, first, second, third, fourth and fifth, metal oxide silicon field effect transistors are provided;

output terminal means deposited on said dielectric and having one portion extending through said dielectric into contact with said common diffusion region and having another portion forming a terminal bonding pad;

first and second input signal terminal means each deposited on said dielectric layer and each having a portion extending through said dielectric layer into contact with said third and said fourth diffusion regions, respectively;

ground terminal means deposited on said dielectric and having a first portion extending through the dielectric into contact with said first and second continuous diffusion regions, a second portion coupled to a corresponding first and second continuous diffusion regions of at least one other cell, and a third portion forming a bonding pad; and power buss means deposited on said dielectric and having a first portion extending through said dielectric into contact with said fifth diffusion region, a second portion coupled to a corresponding fifth diffusion region of at least said one other cell, and a third portion forming a bonding pad whereby a plurality of standard cells having basic logic circuitry therein are provided, each cell having at least five transistors which share a common diffusion region, and with predetermined inter-cell connections form a preselected one of a plurality of functional circuits.

2. The device of claim 1 wherein the fifth transistor of each said cell further comprises:

one segment of said fifth diffusion region spaced from another portion, the region therebetween defining a channel region; and a sixth gate electrode deposited on said dielectric layer and operatively associated with said segments of said fifth diffusion region, and further, said segments, said fifth and sixth gate electrodes and said common diffusion region connected to function as a single high resistance transistor.

3. The device of claim 2 wherein:

said first, second, third, fourth and fifth diffusion region each have widths selected such that resistance ratio of the second transistor, with respect to the resistance of the first transistor, is one, of the third transistor is less than one, of the fourth transistor is greater than one, and of the fifth transistor is at least ten.

4. The device of claim 3 wherein:

said resistance ratio of the third transistor is one-half, the fourth transistor is four, and the fifth transistor is sixteen.

5. The device of claim 3 further comprising:

a sixth diffusion region formed in the substrate proximate said third diffusion region;

a seventh diffusion region formed in the substrate proximate said sixth diffusion region and defining a seventh channel region therebetween;

a seventh gate electrode deposited on said dielectric layer above said seventh channel region and having a portion forming a terminal bonding pad;

said second input signal terminal means having another portion extending through said dielectric and into contact with said sixth diffusion region; and third input signal terminal means deposited on said dielectric and having one portion extending through said dielectric layer and into contact with said seventh diffusion region, and having another portion forming a terminal bonding pad.

* * * * *